(12) United States Patent
Teranuma et al.

(10) Patent No.: US 6,392,217 B1
(45) Date of Patent: May 21, 2002

(54) TWO-DIMENSIONAL IMAGE DETECTING DEVICE AND MANUFACTURING METHOD THEREOF

(75) Inventors: Osamu Teranuma, Tenri; Yoshihiro Izumi, Kashihara, both of (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 09/437,470

(22) Filed: Nov. 10, 1999

(30) Foreign Application Priority Data

Nov. 19, 1998 (JP) .......................................... 10-329191

(51) Int. Cl.[7] .............................................. H01L 27/00
(52) U.S. Cl. ................................ 250/208.1; 250/370.13
(58) Field of Search ............ 250/208.1, 370.07–370.14; 257/290, 443, 452

(56) References Cited

U.S. PATENT DOCUMENTS

| | | | | |
|---|---|---|---|---|
| 5,420,452 A | * | 5/1995 | Tran et al. | 257/428 |
| 6,020,590 A | * | 2/2000 | Aggas et al. | 250/370.09 |
| 6,242,746 B1 | * | 6/2001 | Teranuma et al. | 250/370.13 |
| 6,262,408 B1 | * | 7/2001 | Izumi et al. | 250/208.1 |

OTHER PUBLICATIONS

Japanese Kokai (Published unexamined patent application) No. 342098/1994 (Tokukaihei 6–342098, Published Date: Dec. 13, 1994) (partial translation).

Lee et al, "A New Digital Detector for Projection Radiography", SPIE, vol. 2432 (1995), pp. 237–249.

Jeromin et al, "Application of a–Si Active–Matrix Technology in a X–Ray Detector Panel", SID 97 Digest, (1997), pp. 91–94.

* cited by examiner

Primary Examiner—Que T. Le
Assistant Examiner—Thanh X. Luu
(74) Attorney, Agent, or Firm—Nixon & Vanderhye P.C.

(57) ABSTRACT

A two-dimensional image detecting device is provided with an active-matrix substrate including electrode wires, switching elements, and pixel electrodes; and an opposing substrate including electrode sections and a semiconductive layer. The substrates are disposed such that pixel electrodes and a semiconductive layer oppose each other, and are electrically connected with each other via a conductive material. Projecting electrodes are formed in accordance with the pixel electrodes on a connecting surface of at least one of the active-matrix substrate and the opposing substrate. An exterior wall is formed by a sealing material at an edge of the connecting surface so as to shut off a space between the substrates. With this arrangement, spaces among the projecting electrodes are sealed from the outside; thus, when air in the outside is allowed to be pressurized, it is possible to apply the same pressure as an external pressure due to a pressure difference between the outside and the space between the bonding surfaces of the substrates. Consequently, the active-matrix substrate and the opposing substrate can be connected to each other with high reliability.

21 Claims, 13 Drawing Sheets

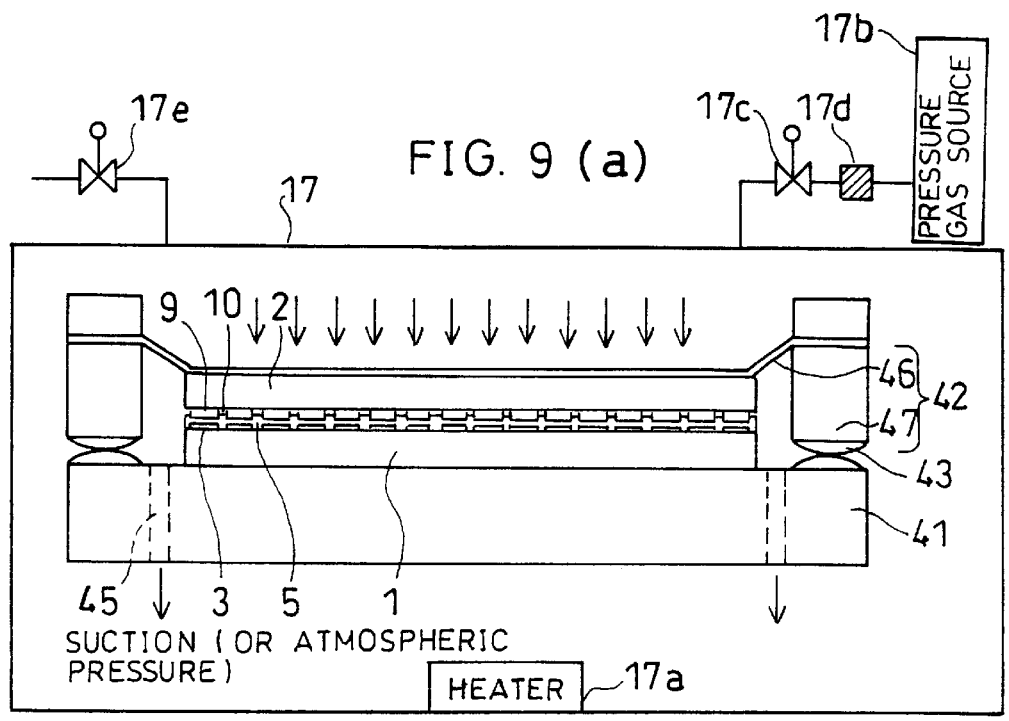
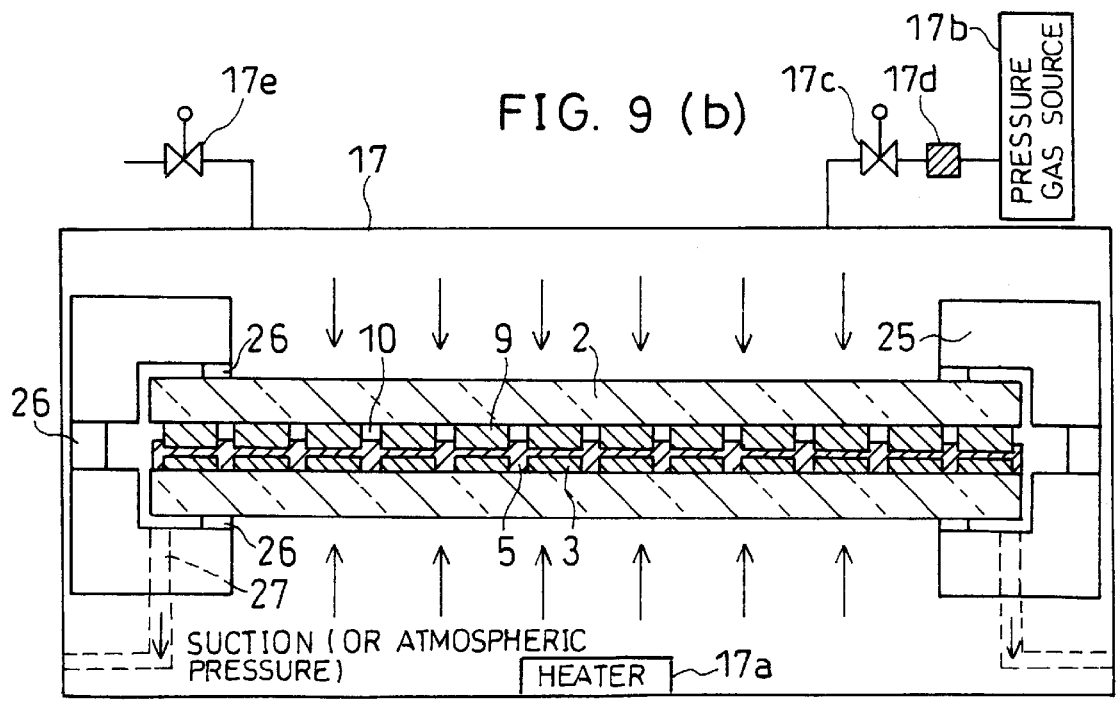

6,392,217 B1

TWO-DIMENSIONAL IMAGE DETECTING DEVICE AND MANUFACTURING METHOD THEREOF

FIELD OF THE INVENTION

The present invention relates to a two-dimensional image detecting device which can detect an image of radiation such as an X-ray, a visible radiation, or an infrared radiation, and further concerns a manufacturing method thereof.

BACKGROUND OF THE INVENTION

Conventionally, a two-dimensional image detecting device for radiation has been known in which semiconductor sensors for detecting an X-ray by generating electrical charge (electron-hole pair) are two-dimensionally disposed in a matrix form, each sensor is provided with an electrical switch, and the electrical switches are successively turned on for each line and electrical charge of the sensors is read for each raw. A specific structure and principle of such a two-dimensional image detecting device are described in "D. L. Lee, et al., 'A New Digital Detector for Projection Radiography', SPIE, 2432, pp. 237–249, 1995", "L. S. Jeromin, et al., 'Application of a-Si Active-Matrix Technology in a X-ray Detector Panel', SID 97 DIGEST, pp. 91–94, 1997", and Japanese Laid-Open Patent Publication No.342098/1994 (Tokukaihei 6-342098).

Referring to FIGS. 11 and 12, the following explanation describes the specific structure and principle of the conventional two-dimensional image detecting device for radiation.

FIG. 11 is a schematic diagram showing the conventional construction of the two-dimensional image detecting device for radiation. Further, FIG. 12 is a schematic diagram showing a sectional structure for one pixel of the two-dimensional image detecting device for radiation.

As shown in FIGS. 11 and 12, the two-dimensional image detecting device for radiation is provided with an active-matrix substrate having electrode wires (gate electrode 52 and source electrode 53) in an XY matrix form, a thin film transistor (TFT) 54 and a storage capacitor (Cs) 55, on a glass substrate 51. Moreover, a photoconductive film 56, a dielectric layer 57, and an upper electrode 58 are formed on virtually the entire surface of the active-matrix substrate.

The storage capacitor 55 has a construction in which a Cs electrode 59 is opposed via an insulating film 61 to a pixel electrode 60 connected with a drain electrode of the thin-film transistor 54.

For photoconductive film 56, a semiconductive material is used to generate electrical charge (electron-hole pair) by exposure to radiation such as an X-ray. According to the aforementioned literatures, amorphous selenium (a-Se), which has high dark resistance and favorable photoconductivity, has been used for the photoconductive film 56. The photoconductive film (a-Se) 56 is formed with a thickness of 300~600 μm by using a vacuum evaporation method.

Further, an active-matrix substrate, which is formed in a manufacturing process of a liquid crystal display device, can be applied to the aforementioned active-matrix substrate. For example, the active-matrix substrate used for an active matrix liquid crystal display device (AMLCD) is provided with the TFT made of amorphous silicon (a-Si) or polysilicon (p-Si), an XY matrix electrode, and a storage capacitor. Therefore, only a few changes in arrangement make it easy to use the active-matrix substrate as that of the two-dimensional image detecting device for radiation.

The following explanation describes a principle of operations of the two-dimensional image detecting device for radiation having the above-mentioned structure.

Electrical charge (electron-hole pair) is generated in the photoconductive film 56 when the photoconductive film 56 such as an a-Se film is exposed to radiation. As shown FIGS. 11 and 12, in the two-dimensional image detecting device, the photoconductive film 56 and the storage capacitors (Cs) 55 are electrically connected in series with each other; thus, when voltage is applied between the upper electrode 58 and the Cs electrode 59 in the two-dimensional image detecting device for radiation, electrical charge (electron-hole pair) generated in the photoconductive film 56 moves to a positive electrode side and a negative electrode side. As a result, the storage capacitors (Cs) 55 stores electrical charge. Further, an electron blocking layer 62 made of a thin insulating layer is formed between the photoconductive film 56 and the storage capacitor (Cs) 55. The electron blocking layer 62 acts as a blocking photodiode for preventing electrical charge from being injected from one side.

With the above-mentioned effect, the thin-film transistor (TFT) 54 comes into an open state in response to input signals of gate electrodes G1, G2, G3, . . . , and Gn so that the electrical charge stored in the storage capacitors (Cs) 55 can be applied to the outside from source electrodes S1, S2, S3, . . . , and Sn. The electrode wires (gate electrodes 52 and source electrodes 53), the thin-film transistor (TFT) 54, and the storage capacitors (Cs) 55, etc. are made in a matrix form; therefore, it is possible to obtain two-dimensional image information of an X-ray by line sequentially scanning signals inputted to gate electrodes G1, G2, G3, . . . , and Gn.

Additionally, in the case when the photoconductive film 56 has photoconductivity for a visible radiation and an infrared radiation as well as for the radiation such as an X-ray, the above-mentioned two-dimensional image detecting device for radiation acts as a two-dimensional image detecting device for detecting the visible radiation and the infrared radiation.

However, the conventional two-dimensional detecting device for radiation has used a-Se as the photoconductive film 56. Since the a-Se has dispersive conductivity of photoelectric current, that is peculiar to amorphous materials, the a-Se is inferior in response. The a-Se does not have sufficient sensitivity (S/N ratio) to an X-ray. Therefore, the conventional two-dimensional detecting device for radiation has a drawback as follow: the storage capacitor (Cs) 55 needs to be exposed to the X-ray for a long time to be fully charged, before reading information.

Further, in order to prevent electrical charge from being stored in the storage capacitor due to leakage current upon irradiation of X-ray, and in order to reduce leakage current (dark current) and to provide a protection against high voltage, the dielectric layer 57 is provided between the photoconductive film (a-Se) 56 and the upper electrode 58. However, it is necessary to add a sequence for removing electrical charge remained in the dielectric layer 57 for each frame; thus, the above-mentioned two-dimensional image detecting device can be used only when photographing a static picture.

In response to this problem, in order to obtain image data corresponding to a moving image, it is necessary to use the photoconductive film 56 instead of the a-Se. The photoconductive film 56 is made of a crystal (or polycrystal) material and a material being superior in X-ray sensitivity (S/N ratio). If the sensitivity of the photoconductive film 56 improves, it becomes possible to sufficiently charge the storage capacitor (Cs) 55 even when X-ray is applied for a short time, and high voltage does not need to be applied to the photoconductive film 56; thus, the dielectric layer 57 is not necessary.

As photoconductive materials which are superior in X-ray sensitivity, CdTe and CdZnTe have been known. Generally, photoelectricity absorption for X-ray proportionally increases to the fifth power of the effective atomic number of absorbed substance. For example, if it is assumed that the atomic number of Se is 34 and the effective atomic number of CdTe is 50, the sensitivity is expected to improve by approximately 6.9 times. However, in the case when CdTe or CdZnTe is adopted instead of a-Se as a material of the photoconductive film 56 of the two-dimensional image detecting device for radiation, the following problem arises:

In the case of the conventional a-Se, a vacuum evaporation method can be adopted as a film-forming method and a film can be formed at a normal temperature; thus, it has been easy to form a film on the active-matrix substrate. Meanwhile, in the case of CdTe and CdZnTe, film-forming methods such as an MBE (molecular beam epitaxial) method and an MOCVD (metal organic chemical vapor deposition) method have been known. Especially in view of forming a film on a large substrate, it is understood that the MOCVD method is appropriate.

However, in the case when a material selected from CdTe and CdZnTe is made into a film by using the MOCVD method, the heat decomposition temperature of organic cadmium is approximately 300° C. (dimethyl cadmium (DMCd)), and the respective heat deposition temperatures of organic tellurium is approximately 400° C. (diethyl tellurium (DETe)) or 350° C. (diisopropyl tellurium (DiPTe)); therefore, a high temperature of approximately 400° C. is required for forming a film.

Generally, in the thin-film transistor (TFT) 54 which is formed on the active-matrix substrate, an a-Si film or a p-Si film is used as a semiconductive layer. The a-Si film and a p-Si film are formed at a film-forming temperature of 300–350° C. while hydrogen ($H_2$) being added, in order to improve the semiconductive property. The TFT element formed in such a process has a heat-resistance temperature of approximately 300° C. If the TFT element is processed at a temperature exceeding the heat-resistance temperature, hydrogen is released from the a-Si film and the p-Si film; consequently, the conductive property is degraded.

Therefore, in view of the film-forming temperature, it has been practically difficult to make a material selected from CdTe and CdZnTe into a film on the active-matrix substrate by using the MOCVD method.

SUMMARY OF THE INVENTION

In order to solve the above-mentioned problem, as described in a specification and claims of a U.S. patent application Ser. No. 09/239,855 made by an inventor et al. of the present application, the inventor et al. of the present application are devising a method for separately forming an active-matrix substrate and an opposing substrate and for bonding the substrates via a bonding material.

As the bonding material for bonding the substrates, it is desirable to adopt a material which electrically and physically connects pixel electrodes on the active-matrix substrate and a photoconductive layer on the opposing substrate, and which maintains insulation between the adjacent pixel electrodes. Specifically, it is possible to adopt an anisotropic material in which conductive particles are dispersed in an insulating resin, and a conductive material which can be selectively placed merely on the pixel electrodes by patterning and electrodeposition.

As the above-mentioned anisotropic material, a material has been conventionally known, in which conductive particles are dispersed into an adhesive (binder). The available conductive particles include a metal particle such as Ni, a metal particle such as Ni that is plated with Au, a carbon particle, a metal-film coated plastic particle obtained by plating a plastic particle with Au/Ni, a transparent conductive particle such as ITO (Indium Tin Oxide), and a conductive particle composite plastic obtained by mixing a Ni particle into polyurethane. Moreover, as the adhesive, it is possible to adopt adhesives such as a thermosetting adhesive, a thermoplastic adhesive, and a photo-curing adhesive.

Further, as the conductive material which can be selectively disposed merely on the pixel electrodes, it is possible to adopt a photosensitive resin in which conductive particles and powders are dispersed, a conductive polymer which can be electrodepositted, and others.

In order to separately form the active-matrix substrate and the opposing substrate and to bond them, in the case of any one of the above materials, it is necessary to perform a thermocompression bonding on the entire substrates by using a pressing device, upon bonding the substrates. In this case, it is important to evenly press and heat the entire substrates.

As a method for pressing these substrates (pressing method), a pressing method using a rigid body has been known; however, this method is not so appropriate for bonding large substrates for the following reason. Upon bonding large substrates, it is necessary to apply an extremely large pressure on the entire substrates. For instance, when 40 cm×50 cm substrates are bonded to each other, on the assumption that a material used for bonding the substrates requires a pressure of 10 $kgf/cm^2$, the entire substrates require a pressure of 20000 kgf. Therefore, a large pressing device is necessary. Further, the larger the substrates are, the more difficult it is to evenly press the entire substrates.

Meanwhile, a vacuum pressing method reduces a pressure (vaccum) of a gap between a pair of substrates which are bonded to each other, so that the substrates are pressed by using external atmospheric pressure. This method is superior in evenness of pressure; however, a space is necessary upon reducing a pressure (vaccum) between the substrates. Thus, this method cannot be adopted when the substrates are bonded to each other entirely via an anisotropic conductive material. This is because no space exists between the substrates. Further, this method is a pressing method using atmospheric pressure, so that it is not possible to obtain a pressure exceeding an atmospheric pressure.

The present invention is devised to solve the above-mentioned problems. The object is to provide a two-dimensional image detecting device in which the active-matrix substrate and the opposing substrate are connected to each other with high reliability, and a manufacturing method for the two-dimensional image detecting device that can connect the active-matrix substrate and the opposing substrate with high reliability.

In order to achieve the above-mentioned object, the two-dimensional image detecting device of the present invention, which has an active-matrix substrate including a plurality of electrode wires being disposed in a lattice form so as to intersect at a plurality of intersections, a plurality of switching elements respectively disposed at the intersections, and a plurality of pixel electrodes connected to the electrode wires via the switching elements; and an opposing substrate including electrode sections and a semi-conductive layer having photoconductivity between the electrode sections and the pixel electrodes, is characterized in that the active-matrix substrate and the opposing substrate are disposed such that the pixel electrodes and the semiconductive layer oppose each other, the pixel electrodes and the semiconductive layer are bonded to each other and are electrically connected to each other via a conductive material, a sealing means is further provided at an edge of a connecting surface of either the active-matrix substrate or the opposing substrate for shutting off a space between the active-matrix substrate and the opposing substrate from the outside.

As with the invention of the U.S. application Ser. No. 09/239,855, the above arrangement makes it possible to separately form the active-matrix substrate and the opposing substrate and to form the semiconductive layer on the opposing substrate at a temperature higher than a heat resistance temperature of the switching elements on the active-matrix substrate. Therefore, a semiconductive material such and CdTe and CdZnTe, which has not conventionally been available due to a limit of a film-forming temperature, can be adopted for the semiconductive layer.

Moreover, with this arrangement, the space between the active-matrix substrate and the opposing substrate is sealed from the outside. Thus, when the outside of the active-matrix substrate and the opposing substrate, which are bonded to each other upon manufacturing the device, is allowed to enter a pressurized gas atmosphere by using an autoclave device, etc., it is possible to apply the same pressure as the outside pressure onto the entire substrates because of a pressure difference between the space and the outside. Consequently, the entire substrates can be evenly pressed. Hence, it is possible to provide the two-dimensional image detecting device in which the active-matrix substrate and the opposing substrate are connected to each other with high reliability.

Furthermore, according to this arrangement, the space between the bonding surfaces of the substrates is structurally sealed, so that an additional process is not necessary in a manufacturing process of the two-dimensional image detecting device.

Additionally, according to this arrangement, the sealing means is formed at an edge of the connecting surfaces of the substrates for shutting off the space between the substrates from the outside, so that it is also possible to protect the space between the bonding surfaces of the substrates and to improve the bonding strength.

In order to achieve the above object, a manufacturing method for the two-dimensional image detecting device of the present invention includes the steps of (a) forming the active-matrix substrate which has a plurality of the electrode wires being disposed in a lattice form so as to intersect at a plurality of the intersections, a plurality of the switching elements respectively disposed at the intersections, and a plurality of the pixel electrodes connected to the electrode wires via the switching elements, (b) forming the opposing substrate which has the electrode sections and the semiconductive layer having photoconductivity between the electrode sections and the pixel electrodes, (c) disposing the conductive material on either the pixel electrode side of the active-matrix substrate or the semiconductive layer side of the opposing substrate, (d) overlaying the active-matrix substrate and the opposing substrate onto each other such that the pixel electrode side of the active-matrix substrate and the semiconductive layer side of the opposing substrate oppose each other, and (e) bonding the overlaid active-matrix substrate and opposing substrate and connecting the substrates electrically via the conductive material, wherein the step (e) includes performing a heating operation while applying pressure to the substrates by using the autoclave device.

According to this method, it is possible to evenly press the entire substrates regardless of the size of the substrates upon bonding the active-matrix substrate and the opposing substrate, and a pressure for connecting the substrates can be readily adjusted in accordance with a kind of the conductive material. Further, a heating medium has a large density under a pressurized gas atmosphere, so that a heating rate increases in a heating operation, resulting in reduction in the manufacturing time. Therefore, it is possible to provide the manufacturing method for the two-dimensional image detecting device that can connect the active-matrix substrate and the opposing substrate with high reliability.

In order to achieve the above object, a manufacturing method for the two-dimensional image detecting device of the present invention includes the steps of (a) forming the active-matrix substrate which has a plurality of the electrode wires being disposed in a lattice form so as to intersect at a plurality of the intersections, a plurality of the switching elements respectively disposed at the intersections, and a plurality of the pixel electrodes connected to the electrode wires via the switching elements, (b) forming the opposing substrate which has the electrode sections and a semiconductive layer having photoconductivity between the electrode sections and the pixel electrodes, (c) disposing the conductive material on either the pixel electrode side of the active-matrix substrate or the semiconductive layer side of the opposing substrate, (d) overlaying the active-matrix substrate and the opposing substrate onto each other such that the pixel electrode side of the active-matrix substrate and the semiconductive layer side of the opposing substrate oppose each other, and (e) bonding the overlaid active-matrix substrate and opposing substrate and connecting the substrates electrically via the conductive material, wherein before step (e), step (g) is further included for sealing a surrounding part of the overlaid active-matrix substrate and opposing substrate so as to shutting off a space between the active-matrix substrate and the opposing substrate from the outside.

According to this method, in step (e), if the outside of the overlaid active-matrix substrate and opposing substrate is allowed to enter a pressurized gas atmosphere by using the autoclave device, etc., it is possible to evenly press the entire substrates regardless of the size of the substrates upon bonding the active-matrix substrate and the opposing substrate, and a pressure for connecting the substrates can be readily adjusted in accordance with a kind of the conductive material. Therefore, it is possible to provide the manufacturing method of the two-dimensional image detecting device that can connect the active-matrix substrate and the opposing substrate with high reliability.

For a fuller understanding of the nature and advantages of the invention, reference should be made to the ensuing detailed description taken in conjunction with the accompanying drawings.

BRIEF DESCRIPTION OF THE DRAWINGS

FIGS. 9(a) and 9(b) are sectional drawings showing a manufacturing device of a two-dimensional image detecting device in accordance with a fourth embodiment of the present invention.

DESCRIPTION OF THE EMBODIMENTS

Figure 1:
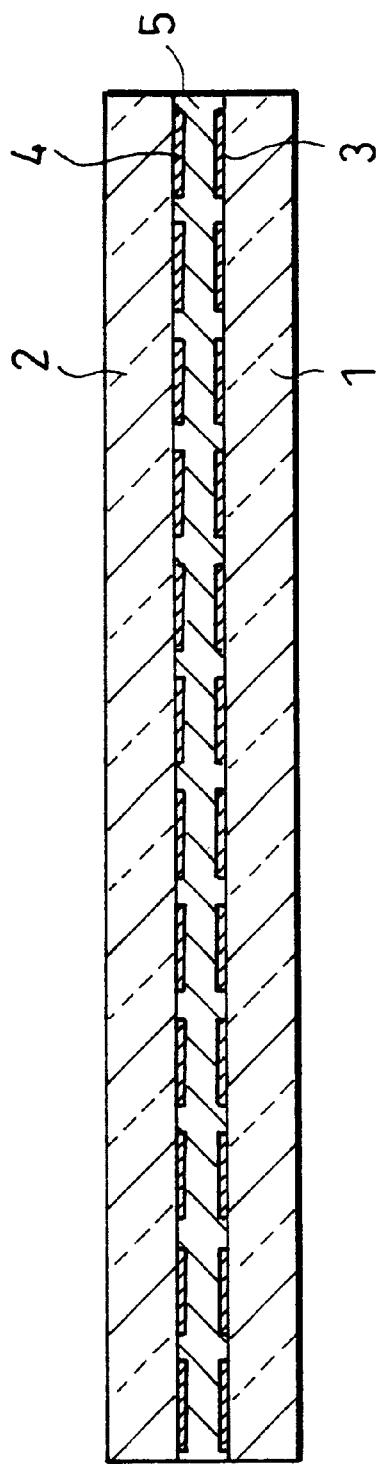
FIGS. 1(*a*) and 1(*b*) are sectional drawings schematically showing a construction of a two-dimensional image detecting device in accordance with a first embodiment of the present invention.
Figure 1:
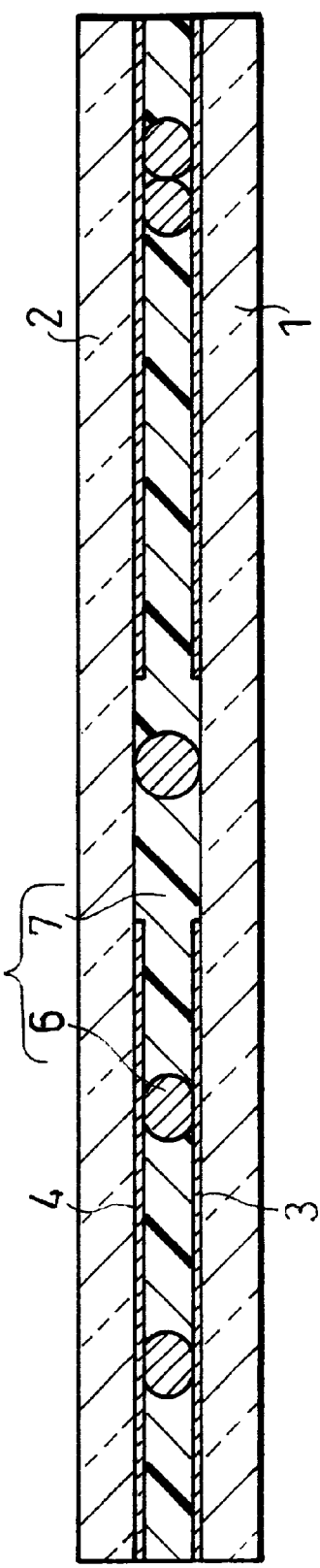

Referring to figures, the following explanation fully describes embodiments of the present invention. Here, all "conductive materials" have adhesion in the following embodiments.

Embodiment 1

FIGS. 1(a) and 1(b) show a two-dimensional image detecting device in accordance with a first embodiment of the present invention. FIG. 1(a) is a sectional drawing schematically showing the entire construction of the two-dimensional image detecting device. FIG. 1(b) is an enlarged sectional drawing showing a partial construction of the two-dimensional image detecting device.

As shown in FIG. 1(a), the two-dimensional image detecting device of the present embodiment has a construction in which an active-matrix substrate 1 having pixel electrodes 3 and an opposing substrate 2 having opposing electrodes 4 are electrically connected and bonded to each other via a conductive material. Here, an anisotropic conductive adhesive 5 is used as a conductive material.

Figure 13:
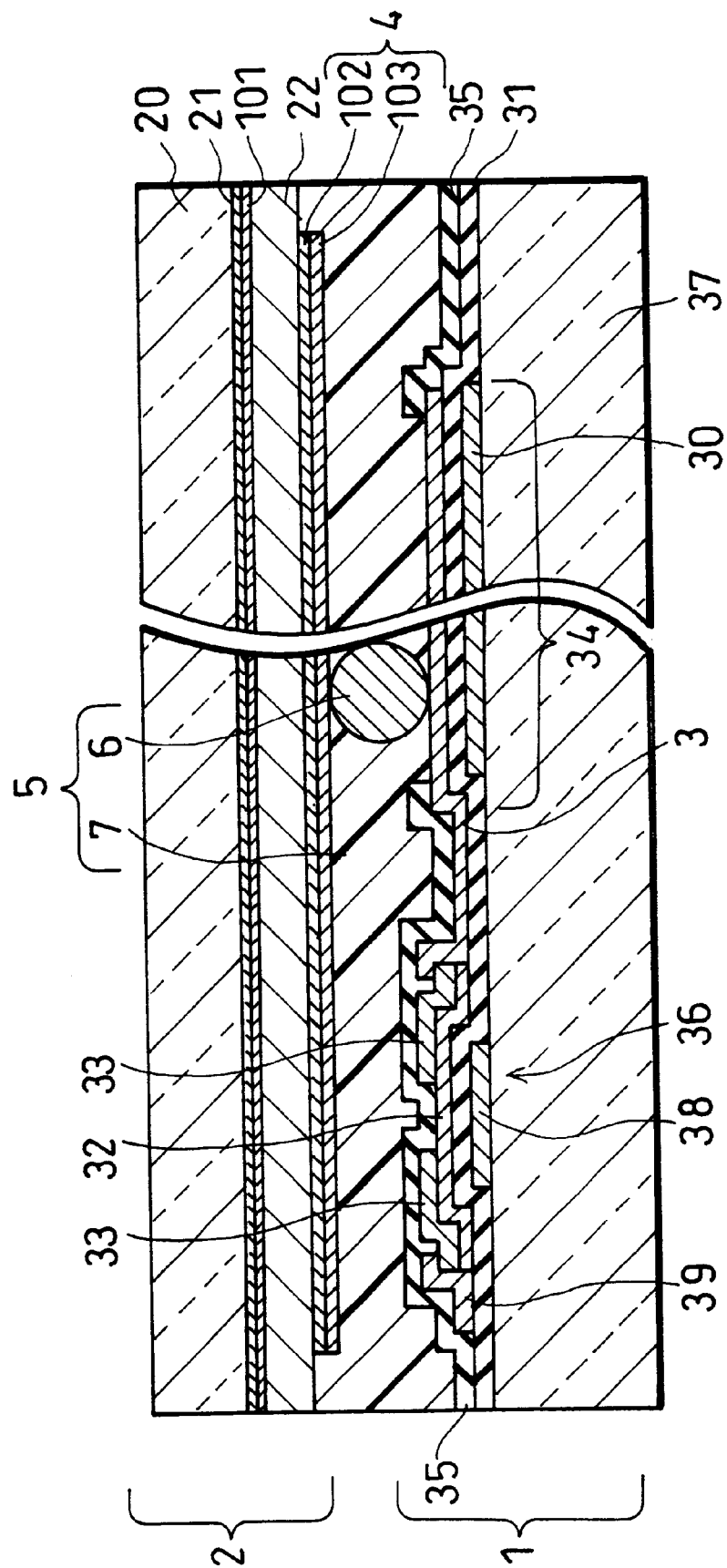
FIG. 13 is a sectional drawing schematically showing a construction for one pixel of the two-dimensional image detecting device in accordance with the first embodiment of the present invention.

Referring to FIG. 13, the following explanation fully describes the construction of one pixel of the two-dimensional image detecting device.

The active-matrix substrate 1 can be formed in the same process as an active-matrix substrate of a liquid crystal display device. Specifically, as shown in FIG. 13, the active-matrix substrate 1 includes a pixel alignment layer having pixel electrode 3 on a glass substrate 37. The pixel alignment layer is constituted by gate electrode 38 and source electrode 39 which are aligned in an XY matrix form (lattice form), a thin film transistor (TFT) 36, and a storage capacitor (Cs) 34 including the pixel electrode 3 which is connected with the source electrode 39 via the TFT 36.

Here, a non-alkali glass substrate (for example, #7059 and #1737 manufactured by Corning Industries, Inc.) is used as the glass substrate 37. The gate electrode 38 including a metal film made of Ta, etc. is formed on the glass substrate 37. Ta, etc. is formed into a film with a thickness of about 3000 Å by sputtering evaporation and the film is patterned into a desired shape so as to complete the gate electrodes 38. At this time, Cs electrode 30 of the storage capacitor 34 is formed as well. Next, an insulating film 31, which is made of a material such as SiNx and SiOx, is formed into a film with a thickness of approximately 3500 Å by using CVD method. The insulating film 31 serves as a gate insulating film of the thin film transistor (TFT) 36 and a dielectric layer between the electrodes (pixel electrode 3 and Cs electrode 30) of the storage capacitor (Cs) 34. Additionally, as the insulating film 31, an anodic oxide film, which is formed by anodizing the gate electrode and the Cs electrode, can be adopted instead of a SiNx film and/or a SiOx film.

And then, (a) an a-Si film (i-layer) 32 serving as a channel part of the thin film transistor (TFT) 36, and (b) an a-Si film ($n^+$-layers) 33 making a contact of the a-Si film 32 with the source electrode 39 and a drain electrode (pixel electrode 3) of the thin film transistor (TFT) 36, are respectively formed into films with thicknesses of approximately 1000 Å and 400 Å by using the CVD method, and these films are patterned into desired shapes. Next, the source electrode 39 and the drain electrode (used for a pixel electrode 3 as well) are formed by including a metal film made of Ta and/or Al, etc. The source electrode 39 and the pixel electrode 3 are obtained by forming the metal film with a thickness of approximately 3000 Å by sputtering evaporation and patterning the metal film into a desired shape.

Afterwards, in order to insulate and protect the substrate surface, a protective insulating film 35 is formed thereon except for an aperture part of the pixel electrode 3. After the insulating film made of a material such as SiNx and SiOx has been made into a film with a thickness of approximately 3000 Å by using the CVD method, the protective insulating film 35 is obtained by patterning the insulating film into a desired shape. As the protective insulating film 35, it is possible to adopt an organic film made of acryl resin and/or polyimide, etc. besides an inorganic insulating film. The above-mentioned process completes the active-matrix substrate 1.

Here, as a TFT element of the active-matrix substrate 1, the TFT 36 using a-Si is adopted with an inverse stagger structure; however, the TFT element is not particularly limited to this structure. It is possible to use p-Si and to adopt a staggering structure.

Meanwhile, the opposing substrate 2 includes a glass substrate which has transparency to an X-ray and a visible light, as a supporting substrate. Specifically, as shown in FIG. 13, in the opposing substrate 2, an upper electrode (electrode part) 21 made of a metal such as Ti and Ag is formed entirely on one of the surfaces of a supporting substrate 20 which is a glass substrate having a thickness of 0.7 mm–1.1 mm. Here, when the present device is used as an image detecting device for a visible light, it is necessary to adopt an electrode such as an ITO electrode, which is transparent to a visible light as the upper electrode 21.

Further, a ZnTe film 101 and a photoconductive layer 22 including a polycrystal film made of CdTe and/or CdZnTe are formed on virtually the entire surface of the upper electrode 21.

Specifically, the ZnTe film 101 is formed on virtually the entire surface of the upper electrode 21. And, a polycrystal film made of CdTe and/or CdZnTe is formed into a film with a thickness of approximately 0.5 mm by using MOCVD method, so as to serve as the photoconductive layer 22. The MOCVD method is suitable for forming a film on a large substrate. The MOCVD method makes it possible to form CdTe and/or CdZnTe into a film at a film forming temperature of 400° C.–500° C. by using an organic cadmium such as dimethylcadmium [DMCd], that is a material of CdTe and CdZnTe, an organic tellurium such as diethyltellurium [DETe] and diisopropyl tellurium [DiPTe], and an organic zinc such as diethylzinc [DEZn], diisopropyl zinc [DiPZn], and dimethylzinc[DMZn].

Additionally, besides the MOCVD method, the polycrystal film serving as the photoconductive layer 22 can be formed by other film-forming methods such as a screen printing and burning method, a proximity sublimation method, an electrodeposition method, and a spraying method.

Moreover, a CdS film 102 is formed on the photoconductive layer 22 (polycrystal film), and a metal film 103 made of a material such as Au, Cu, and ITO is formed into a film by sputtering evaporation. And then, the CdS film 102 and the metal film 103 are patterned in accordance with the pixel electrodes 3 formed on the active-matrix substrate 1, so as to form an opposing electrode 4 constituted by the CdS film 102 and the metal film 103. In the present embodiment, each of the pixel electrode 3 and the opposing electrode 4 is formed into a square having one side of 100 μm, and the electrodes 3 and 4 are aligned with a pitch of 150 μm.

Such an electrode structure forms a photodiode having a PIN bonding structure of ZnTe film 101/CdTe film or CdZnTe film (photoconductive film 22) /CdS film 102, and contributes to a reduction in dark current when an X-ray is not emitted. Here, as for the structure of the blocking photodiode, besides the PIN structure, it is certainly possible to form a photodiode such as an MIS structure, a heterojunction structure, and a shottky junction structure.

Moreover, the present embodiment adopts a photodiode having a three-layer structure of the ZnTe film 101, the CdTe film or the CdZnTe film (photoconductive layer 22), and the CdS film 102. The layer structure of the photodiode and the type of the photoconductive layer are not limited to the above arrangement. However, as for the photoconductive layer, it is preferable to adopt a polycrystal and/or crystal material, that have higher responsivity to an X-ray as compared with an amorphous material. And it is particularly preferable to adopt a II–VI semiconductor which has superior sensitivity to an X-ray. Further, the photoconductive layer preferably includes at least one of CdTe and CdZnTe, which are particularly superior in sensitivity to an X-ray.

Furthermore, in the present embodiment, upon forming the opposing substrate 2, the photoconductive layer 22, etc. is formed on the supporting substrate 20 with the glass substrate serving as the supporting substrate 20. Here, it is also possible to adopt the photoconductive layer 22 (photoconductive substrate) as the supporting substrate.

The active-matrix substrate 1 and the opposing substrate 2 are disposed such that each pixel electrode 3 and each opposing electrode 4 oppose each other in each pixel. As shown in FIG. 1, the anisotropic conductive adhesive 5 is disposed in a gap between the substrates 1 and 2. In this case, the anisotropic conductive adhesive 5 is constituted by conductive particles 6 and an adhesive 7 and electrically connects the opposing substrates 4 and the pixel electrodes 3 via the conductive particles 6. Further, the anisotropic conductive adhesive 5 bonds and fixes the substrates 1 and 2 (pixel electrodes 3 and opposing electrodes 4) by the thermocompression bonding.

Next, the detail of the anisotropic conductive adhesive 5 is discussed.

A typical construction of the anisotropic conductive adhesive 5 is that the conductive particles 6 are dispersed into the insulating adhesive 7. In this case, as the conductive particle 6, it is possible to adopt a metal particle such as Ni particle, a metal particle such as Ni particle that is plated with Au, a carbon particle, a metal-film coated plastic particle obtained by plating a plastic particle with Au/Ni, a transparent conductive particle such as ITO, and a conductive particle composite plastic obtained by mixing a Ni particle into polyurethane.

Moreover, as the adhesive 7, it is possible to adopt adhesives such as a thermosetting adhesive, a thermoplastic adhesive, and a photo-curing adhesive. In the present embodiment, an epoxy resin, a kind of thermosetting adhesive, is adopted.

Additionally, a film type and a paste type are available for the anisotropic conductive adhesive 5. In the present embodiment, a film-type anisotropic conductive adhesive is adopted.

As described above, the two-dimensional image detecting device of the present embodiment has a construction in which the active-matrix substrate 1 and the opposing substrate 2 are disposed such that the pixel electrode 3 and the opposing electrode 4 oppose each other in each pixel, and the substrates 1 and 2 are bonded to each other via the anisotropic conductive adhesive 5 and are electrically connected with each other.

The operation principle of the above-mentioned two-dimensional image detecting device is the same as that of a two-dimensional image detecting device described in the specification of a U.S. patent application Ser. No. 09/239, 855. Specifically, when a radiation such as an X-ray is emitted to the photoconductive layer 22, the photoconductive effect causes electrical charge (electron-positive hole) in the photoconductive layer 22. Here, the storage capacitors 34 and the photoconductive layer 22 are connected in series via the pixel electrodes 3, the anisotropic conductive adhesive 5, and the opposing electrodes 4. Therefore, when voltage is applied between the upper electrode 21 and the Cs electrodes 30, negative and positive electrical charges respectively move to a positive electrode and a negative electrode; consequently, electrical charge is accumulated in the storage capacitors 34.

The following explanation describes a specific pressing method in which the anisotropic conductive adhesive 5 is used so as to bond the active-matrix substrate 1 and the opposing substrate 2. Here, as a pressing method for bonding the substrates 1 and 2, the present embodiment adopts an autoclave method in which an autoclave device applies pressure to the substrates 1 and 2. Additionally, in the present embodiment, the film-type anisotropic conductive adhesive 5 is 10 μm in thickness and the conductive particle 6 is 10 μm in diameter. Further, as the adhesive 7 of the anisotropic conductive adhesive 5, an adhesive, which is softened at around 80° C. and is cured at around 150° C., is adopted.

There occurs a problem that air bubbles are caught during the bonding operation of the substrates. Most air bubbles are reduced in size, scattered, or disappear by pressing; however, when extremely large air bubbles are caught, some of them may not be still sufficiently small relative to a pixel size, even after the air bubbles are pressed to be smaller. In this case, a connecting defect may occur between the upper and lower substrates 1 and 2. Thus, it is necessary to a degree to prevent air bubbles from being caught, before the pressing operation.

Figure 2:
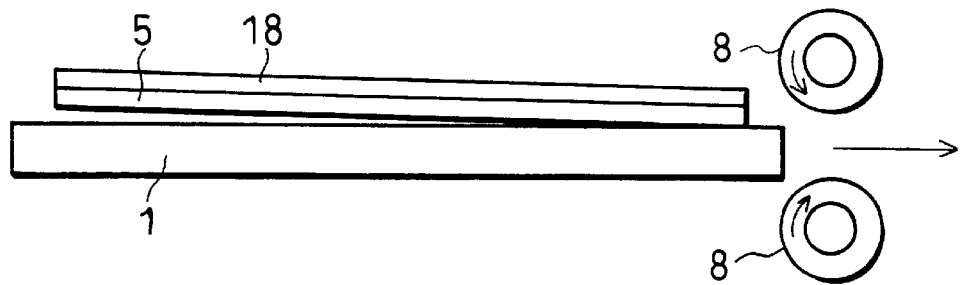
FIGS. 2(a) through 2(c) are side views schematically showing a bonding process of substrates of the two-dimensional image detecting device in accordance with the first embodiment of the present invention.
Figure 2:
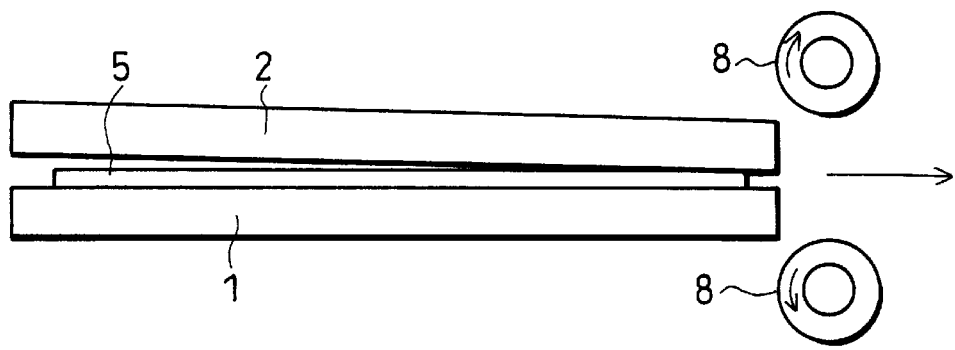
Figure 2:
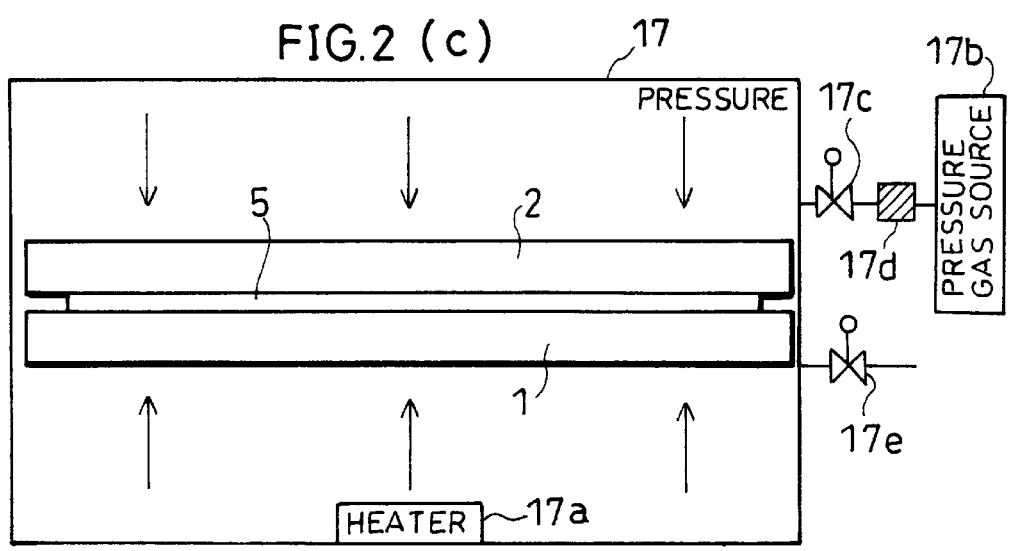

Referring to FIGS. 2(a) through 2(c), the following explanation discusses a specific method for bonding the active-matrix substrate 1 and the opposing substrate 2 by using the anisotropic conductive adhesive 5. Here, FIGS. 1(a) through 1(c) are side views showing the bonding process of the substrates 1 and 2.

Firstly, as shown in FIG. 2(a), upon bonding the active-matrix substrate 1 and the opposing substrate 2, on the active-matrix substrate 1 (or the opposing substrate 2), the anisotropic conductive adhesive 5, which has been formed on a film 18, is disposed so as to oppose the other substrate. Next, the substrates pass through a heating roller device 8, which is a pair of rubber rollers and whose temperature is set at 80° C., at a speed of 1 cm/sec, so that the anisotropic conductive adhesive 5 on a supporting film 7 is transferred onto the active-matrix substrate 1.

And then, as shown in FIG. 2(b), the active-matrix substrate 1, on which the anisotropic conductive adhesive 5 has been transferred, and the opposing substrate 2 are arranged so as to oppose each other. And the substrates pass through the heating roller device 8 at a speed of 1 cm/sec, so that the active-matrix substrate 1 and the opposing substrate 2 are temporarily connected (temporarily contact-bonded) with each other.

Successively, as shown in FIG. 2(c), the temporarily connected substrates 1 and 2 are subjected to thermocompression (pressing) in an autoclave device 17 for about ten minutes at 180° C. and 20 kgf/cm².

The autoclave device 17 is provided with a heater 17a for heating the inside of the autoclave device 17, a pressurized gas source 17b such as a gas cylinder (high-pressure gas container) which supplies high-pressure gas such as air and nitrogen gas for pressing, an open/close valve 17c which stops supplying high-pressure gas from the pressurized gas source 17a to the autoclave device 17, a regulator 17d which regulates high-pressure gas supplied from the pressurized gas source 17a to the autoclave device 17 so as to adjust pressure in the autoclave device 17, and an evacuation valve 17e for evacuating high-pressure gas from the autoclave device 17.

In the thermocompression performed by the autoclave device 17, the pressure of high-pressure gas from the pressurized gas source 17b is set at a predetermined pressure (20 kgf/cm²) by the regulator 17d, and the open/close valve 17c is opened so as to pressurize the inside of the autoclave device 17 at a predetermined pressure (20 kgf/cm²) Here, a temperature in the device (temperature in the autoclave device 17) is kept low so as not to cure the anisotropic conductive adhesive 5 until the pressure in the autoclave device 17 reaches the predetermined pressure. At this time, the evacuation valve 17e is closed.

After the pressure in the autoclave device 17 reaches the predetermined pressure, the heater 17a heats the inside of the autoclave device 17, so that the temperature in the device increases to a predetermined temperature (180° C.) and is kept at this temperature for a predetermined time (about 10 minutes). Thus, the anisotropic conductive adhesive 5 is cured. After the predetermined time (about ten minutes) elapses, the heater 17a stops heating, the open/close valve 17c is closed, and the evacuation valve 17e is opened. This step completes the thermocompression.

In the above thermocompression, the anisotropic conductive adhesive 5 is cured so as to serve as an anisotropic conductive film (ACF); thus, the substrates 1 and 2 are completely connected with each other. The anisotropic conductive film shows conductivity merely in the normal direction to the surface of the pixel electrode 3, that opposes the opposing electrode 4, so as to electrically connect the pixel electrode 3 and the electrode 4, that oppose each other, and to offer insulation between the electrodes (3·4) which do not oppose each other.

Figure 3:
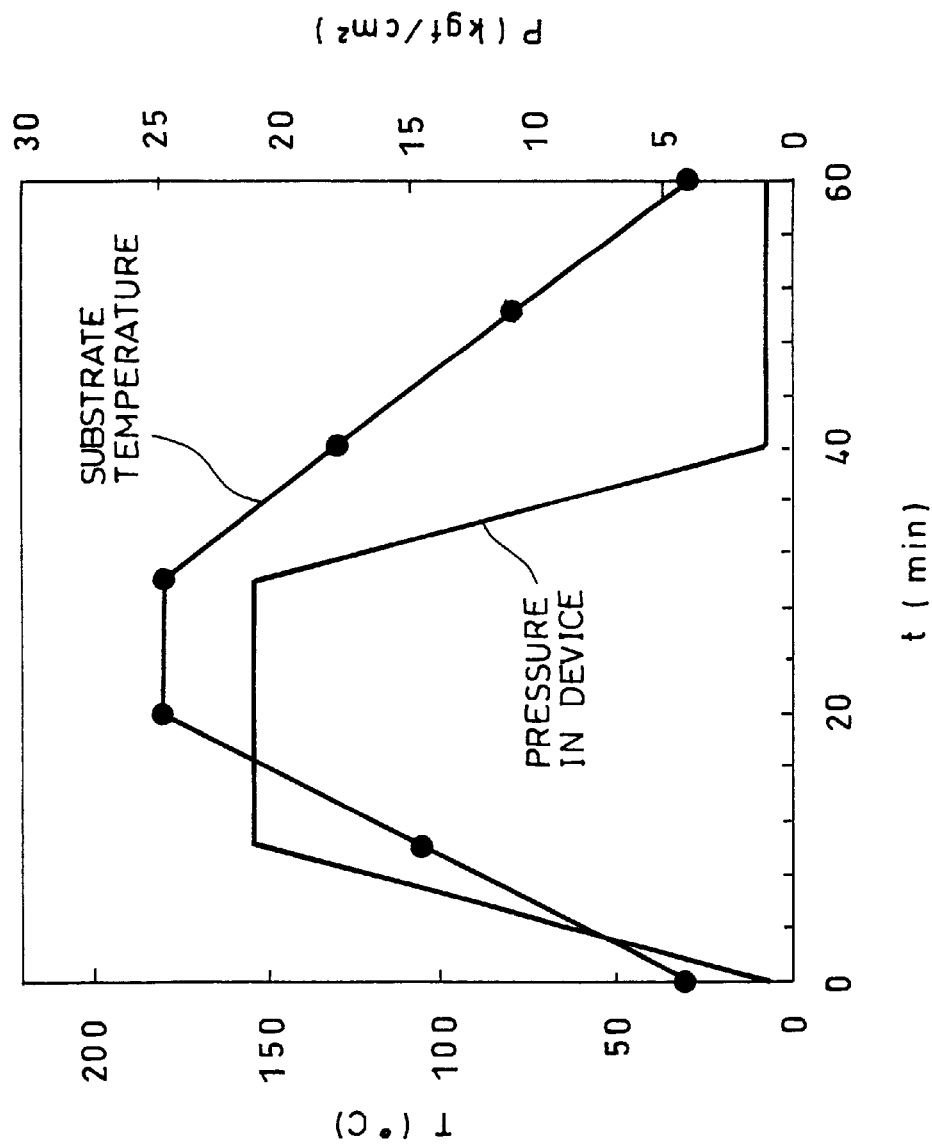
FIG. 3 is a graph showing the progression of a pressure and a temperature over time regarding an autoclave device.

FIG. 3 shows the detail of the progression regarding a substrate temperature (temperatures of the substrates 1 and 2) T [°C.] and a pressure in the device (pressure in the autoclave device 17) P[kg/cm²] relative to elapsed time t [min], in the thermocompression performed by the autoclave device 17.

The above-mentioned process uses the roller heating device 8 for transferring the anisotropic conductive adhesive 5, so that it is possible to perform a transferring operation, which has conventionally required much time and work, relatively with ease in a short time. Further, upon pre-bonding the upper and lower substrates 1 and 2, the substrates 1 and 2 are bonded from the ends through the heating roller device 8, so that it is possible to prevent the bonding surfaces from catching air bubbles.

Additionally, as a method for transferring the anisotropic conductive adhesive 5 onto the substrates 1 and 2 and for temporarily connecting the substrates 1 and 2, other methods are available in addition to the method using the heating roller device 8. Referring to FIGS. 4(a) through 4(e), the following explanation describes a pressing method which performs a deaerating operation suited for the large substrates 1 and 2.

Figure 4A:
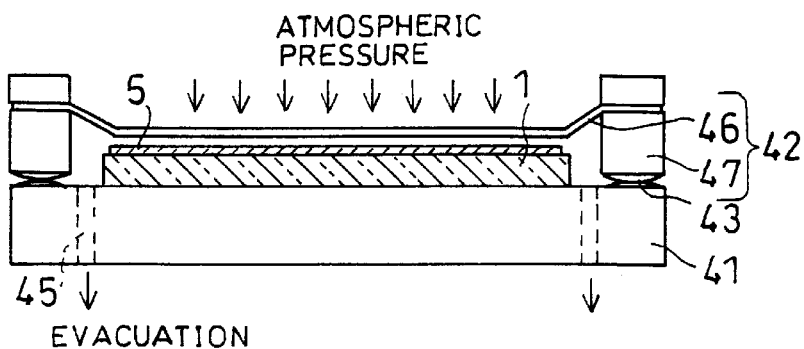
FIGS. 4(a) through 4(e) are sectional drawings schematically showing the bonding process of substrates of the two-dimensional image detecting device in accordance with the first embodiment of the present invention.

Referring to FIG. 4(a), a deaerating device for deaeration is constituted by a surface plate 41 for supporting the active-matrix substrate 1 from the below, a lid 42 which opens and closes for sealing a space above the surface plate 41, a sealing rubber 43 for sealing a gap between the surface plate 41 and the lid 42, and a pressure reducing device (not shown) for reducing pressure of the sealed space above the surface plate 41. The surface plate 41 is provided with an air outlet 45 for evacuating the sealed space above the surface plate 41, and the air outlet 45 is connected with the pressure reducing device. Further, the lid 42 is provided with a flexible film sheet 46 covering virtually the entire space above the surface plate 41, and a metal frame 47 which fixes the film sheet 46 and seals the space between the film sheet 46 and the surface plate 41 at circumferential parts of the surface plate 41.

Firstly, as shown in FIG. 4(a), upon bonding the active-matrix substrate 1 and the opposing substrate 2, the anisotropic conductive adhesive 5 is opposed to the active-matrix substrate 1 on the surface plate 41, and a deaerating operation is carried out between the active-matrix substrate 1 and the anisotropic conductive adhesive 5 in this state. Specifically, the lid 42 is closed, the space above the surface plate 41 is sealed, and air in the space is evacuated through the air outlet 45 by using the pressure reducing device; consequently, pressure is reduced between the active-matrix substrate 1 and the anisotropic conductive adhesive 5.

Figure 4B:
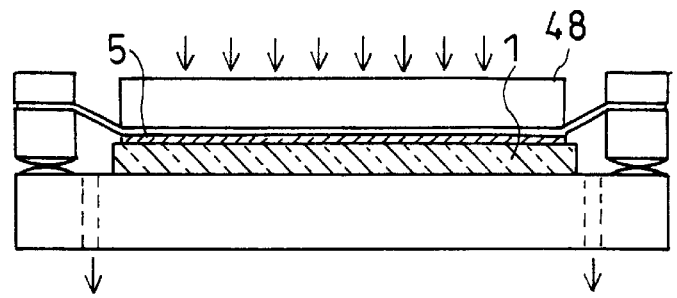

Next, as shown in FIG. 4(b), with continuing the deaeration between the active-matrix substrate 1 and the anisotropic conductive adhesive 5, the anisotropic conductive adhesive 5 is subjected to a thermocompression (80° C., 5–10 kgf/cm$^2$) from above of the film sheet 46 of the deaerating device so as to transfer the anisotropic conductive adhesive 5 onto the active-matrix substrate 1. Specifically, a thermocompression device 48, which is a pressing surface plate heated to 80° C., applies pressure of 5–10 kgf/cm$^2$ to the anisotropic conductive adhesive 5 via the film sheet 46. Afterwards, the thermocompression device 48 is taken off and the lid 42 is opened so as to eliminate the state of reduced pressure.

Figure 4C:
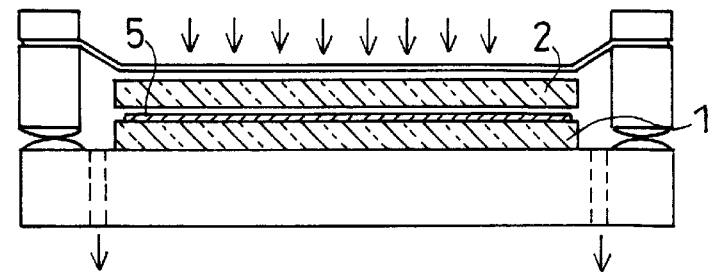

Next, as shown in FIG. 4(c), the opposing substrate 2 is disposed at a bonding position so as to oppose the active-matrix substrate 1, on which the anisotropic conductive adhesive 5 has been transferred. In this state, the above-mentioned deaerating operation is carried out between the active-matrix substrate 1 and the opposing substrate 2.

Figure 4D:
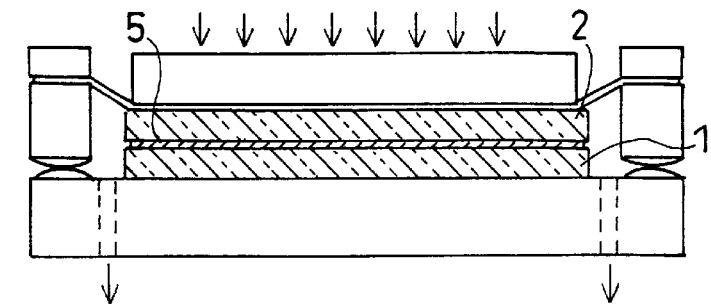

And then, as shown in FIG. 4(d), during the deaerating operation between the active-substrate 1 and the opposing substrate 2, the opposing substrate 2 is subjected to the above-mentioned thermocompression (80° C., 5–10 kgf/cm$^2$) from above of the film sheet 46 of the deaerating device so as to pre-bond the active-matrix substrate 1 and the opposing substrate 2. Afterwards, the thermocompression device 48 is taken off and the lid 42 is opened so as to eliminate the state of reduced pressure in the space above the surface plate 41.

Figure 4E:
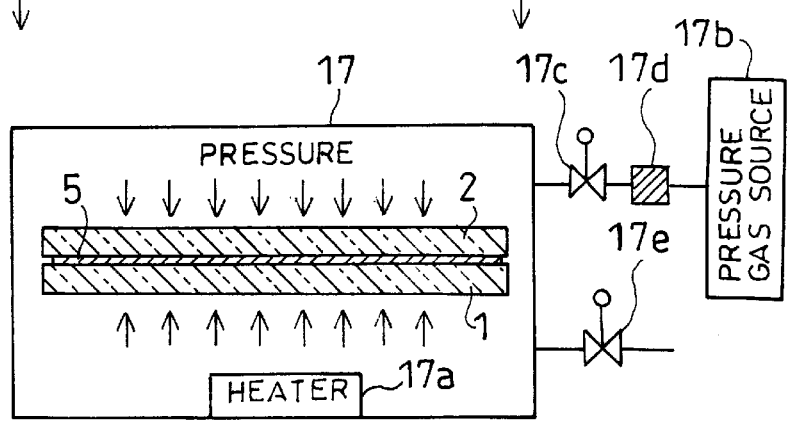

Finally, as shown in FIG. 4(e), the temporarily connected substrates 1 and 2 are subjected to a thermocompression (pressing) for about ten minutes at 180° C. and 20 kgf/cm$^2$ by using the autoclave device 17. This operation cures the anisotropic conductive adhesive 5 and bonds the active-matrix substrate 1 and the opposing substrate 2 (post bonding).

In the above-mentioned bonding process of the substrates 1 and 2, the deaerating operation is performed when the anisotropic conductive adhesive 5 is transferred onto the active-matrix substrate 1, and the deaerating operation is further performed when the opposing substrate 2 is pre-bonded. Thus, it is possible to more positively prevent the substrates from catching air bubbles before the bonding is completed by pressing of the autoclave device 17.

Additionally, the present embodiment described the case in which the anisotropic conductive adhesive 5 is transferred onto the active-matrix substrate; however, the anisotropic conductive adhesive 5 can be transferred to the opposing substrate 2. Further, instead of the thermocompression device 48, other devices such as heating rollers are available.

As mentioned above, the two-dimensional image detecting device of the present embodiment is characterized in that a thermocompression is performed by the pressing of the autoclave device 17 so as to connect the active-matrix substrate 1 and the opposing substrate 2 via the anisotropic conductive adhesive 5, the active-matrix substrate 1 including the electrode wires (gate electrodes 38 and source electrodes 39) made in a lattice form, a plurality of the thin film transistors 36 disposed respectively at the intersections, and a plurality of the pixel electrodes 3 disposed respectively at the intersections, and the opposing substrate 2 including the photoconductive layer 22, which has photoconductivity, on virtually the entire surface. Regardless of the size of the substrates 1 and 2 to be bonded, it is possible to evenly press, the substrates. Further, depending upon the ability of the autoclave device 17, pressure can be adjusted from 1 kgf/cm$^2$ to several hundreds kgf/cm$^2$.

Moreover, the present embodiment heats air in a chamber (space in the deaerating device) while deaerating, so that the heat distribution is preferably even, and the temperature distribution can be considerably small between the substrates even when a plurality of substrates to be bonded are subjected to a thermocompression at the same time.

Embodiment 2

A two-dimensional image detecting device of the present invention is not limited to a construction of FIG. 1. The following explanation discusses another construction of the two-dimensional image detecting device described in Embodiment 1.

Here, the construction of the two-dimensional image detecting device of the present embodiment is similar to that of the two-dimensional image detecting device of Embodiment 1, that is shown in FIG. 1; thus, those members that have the same functions and that are described in Embodiment 1 are indicated by the same reference numerals and the description thereof is omitted.

Like the two-dimensional image detecting device of Embodiment 1, the two-dimensional image detecting device of the present embodiment has a construction in which an active-matrix substrate 1 and an opposing substrate 2 are electrically connected and joined to each other by bonding via an anisotropic conductive adhesive 5.

Here, the two-dimensional image detecting device of the present embodiment is provided with projecting electrodes (bump) 9 serving as projections on electrodes of at least one of the substrates (either pixel electrodes 3 on the active-matrix substrate 1 and/or opposing electrodes 4 on the opposing substrate 2), for the following reasons.

In this arrangement, conductive particles 6 are dispersed in the anisotropic conductive adhesive 5, and the conductive particles 6 are brought into contact with the electrodes 3 and 4 respectively formed on the upper and lower substrates (active-matrix substrate 1 and opposing substrate 2), so as to obtain electrical connection between the electrodes 3 and 4. In order to secure electrical connection between the electrodes 3 and 4 formed on the substrates 1 and 2, it is necessary to press the substrates 1 and 2 until a gap between the substrates 1 and 2 becomes equal to or smaller than a diameter of the conductive particle 6, and it is necessary to prevent leak from appearing between the adjacent electrodes (3 or 4) on the same substrate (1 or 2).

However, when the upper and lower substrates 1 and 2 have virtually the even surfaces and a diameter of the conductive particle 6 is less than a film thickness of the anisotropic conductive adhesive 5, it is not possible to reduce the gap between the substrates 1 and 2 to be equal to or smaller than the film thickness of the anisotropic conductive adhesive 5; thus, electrical connection cannot be obtained between the electrodes 3 and 4 formed on the upper and lower substrates 1 and 2.

The anisotropic conductive adhesive 5 used in Embodiment 1 is manufactured such that the film thickness is equal to the diameter of the conductive particle 6. However, even in this case, it is not possible to prevent some unevenness in the diameters of the conductive particles 6, so that a connecting defect may occur due to some of the conductive particles 6 having small diameters. Further, in this case, even if electrical connection is obtained, the gap between the substrates 1 and 2 cannot be reduced to less than the film thickness of the anisotropic conductive adhesive 5. For this reason, the contact areas between the conductive particles 6 and the electrodes may become small, resulting in degradation in reliability of the product.

In order to solve the above problem, as shown in FIGS. 5(a) and 5(b), the two-dimensional image detecting device of the present embodiment has a construction in which the projecting electrodes (bump) 9 are provided on either electrodes 3 or 4 of the substrates 1 and 2. In this arrangement, in grooves 10 between the projecting electrodes 9, which are formed so as to be adjacent to each other on the substrates 1 and 2, spaces are available for entry of the anisotropic conductive adhesive 5; thus, the gap between the substrates 1 and 2 can be reduced to less than the film thickness of the anisotropic conductive adhesive 5, and further to less than the diameter of the conductive particle 6. Therefore, the conductive particles 6 can positively realize electrical connection between the substrates 1 and 2.

Moreover, at least until the spaces of the grooves 10 between the projecting electrodes 9 are filled with the anisotropic conductive adhesive 5, no pressure is applied to the grooves 10. Hence, the conductive particles 6 in the grooves 10 are not deformed. Thus, it is possible to reduce the possibility of leak between the adjacent electrodes (3 and 4) on the same substrate (1 or 2).

Further, upon bonding the substrates 1 and 2, on which the projecting electrodes 9 are formed, via the anisotropic conductive adhesive 5 by using an autoclave method, it is necessary to seal the grooves 10, which appear between the projecting electrodes 9, from the outside of the bonding surfaces of the substrates 1 and 2. If the spaces of the grooves 10 appearing between the projecting electrodes 9 are not sealed from the outside, the spaces are pressurized together with the outside, so that the anisotropic conductive adhesive 5 cannot enter the spaces of the grooves 10 upon contact-bonding the substrates 1 and 2. In this case, it is not possible to obtain the effect to be made by the projecting electrodes 9.

Further, methods for forming the projecting electrodes 9 include a plating method, a stud bump method, an etching method, and a sandblasting method. The projecting electrodes 9 can be made of a metal such as Au, Cu, In, and solder, or made by stacking these metals, with a height of several $\mu$ms to a few tens of $\mu$ms. Additionally, the projecting electrodes 9 can be also formed in the following manner: on the connecting surface of the semiconductive layer made of a material such as CdTe and CdZnTe, grooves are formed with a height of several $\mu$ms to a few tens of $\mu$ms by the etching method and the sandblasting method. Here, as shown in FIG. 5(b), the present embodiment forms the projecting electrodes 9 on the opposing substrate 2 in view of convenience for the manufacturing process.

Figure 5:
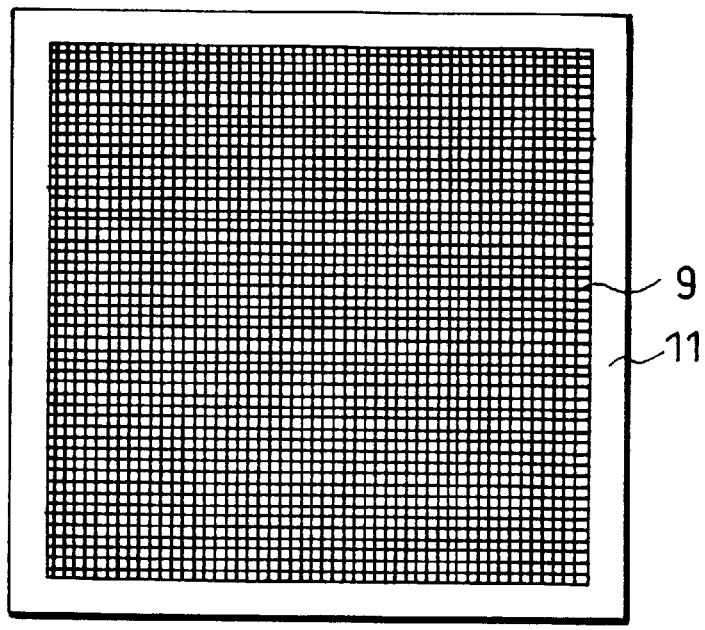
FIGS. 5(a) and 5(b) are a plan view and a sectional drawing schematically showing a construction of a two-dimensional image detecting device in accordance with a second embodiment of the present invention.
Figure 5:
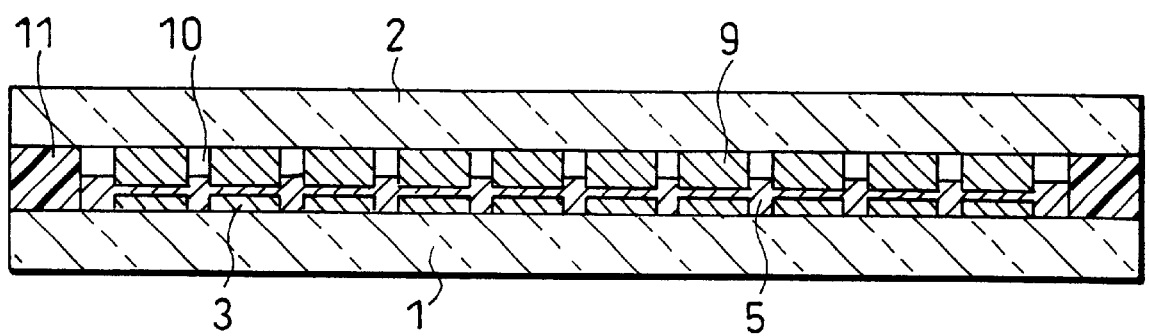

Referring to FIG. 5, the following explanation describes a method for sealing the grooves 10, which appear between the projecting electrodes 9 on the opposing substrate 2, from the outside of the bonding surface.

As shown in FIGS. 5(a) and 5(b), in the two-dimensional image detecting device of the present embodiment, a sealing material (sealing resin) is disposed around the bonding surfaces (connected surfaces) of the substrates 1 and 2 with a width of about 1 cm so as to form an exterior wall 11 (sealing means) 11; thus, the space between the bonding surfaces are sealed. Specifically, like an adhesive 7 of the anisotropic conductive adhesive 5, an epoxy resin is adopted for the sealing material forming the exterior wall 11, and the resin is cured together with the anisotropic conductive adhesive 5 during a thermocompression by the autoclave device 17. Further, the exterior wall 11 has a large width of about 1 cm so as to be resistant to some pressure in a softening state before the thermosetting operation. The height of the exterior wall 11 is set at about 12 $\mu$m, which is slightly higher than 10 $\mu$m of the bump (projecting electrode 9). Thus, it is easy to seal the space between the bonding surfaces of the substrates 1 and 2 from the outside.

Additionally, the two-dimensional image detecting device of the present embodiment adopts an epoxy resin as the sealing material forming the exterior wall 11, which seals the space between the bonding surfaces of the substrates 1 and 2 from the outside. Besides, it is possible to adopt other resins such as silicone resin having superior heat-resistance and hermeticity.

Figure 6:
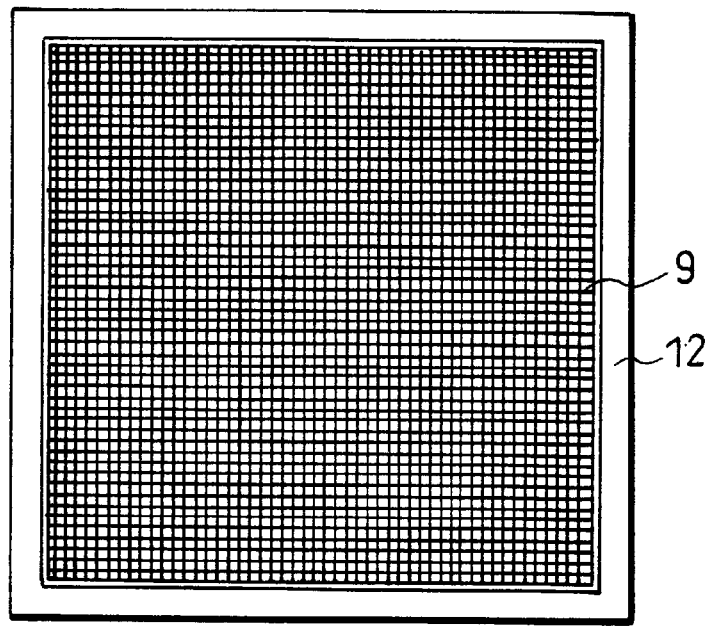
FIGS. 6(a) and 6(b) are a plan view and a sectional drawing schematically showing a construction of the two-dimensional image detecting device in accordance with a second embodiment of the present invention.
Figure 6:
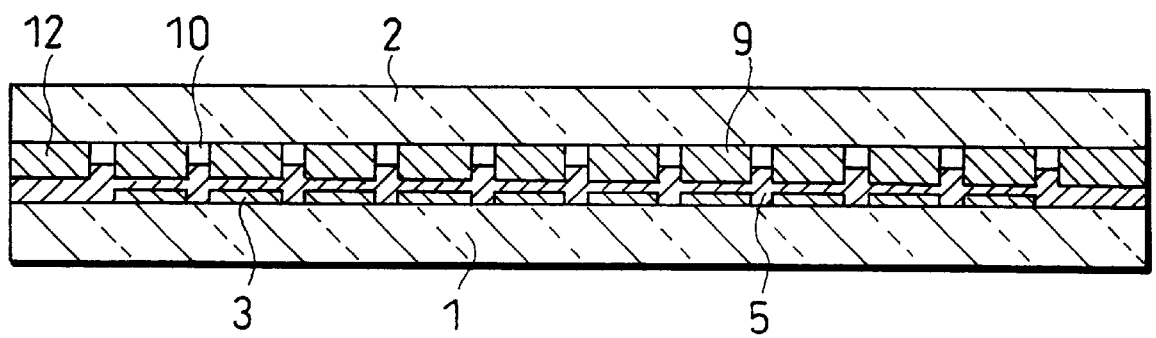

Moreover, in the present embodiment, the exterior wall 11, which seals the space between the bonding surfaces of the substrates 1 and 2 from the outside, is made of a sealing material. The method for forming the exterior wall is not limited to the above method in the present invention. For instance, as shown in FIGS. 6(a) and 6(b), upon forming the projecting electrodes 9, it is also possible to form an exterior wall 12 made of the same material as the projecting electrodes 9 around the bonded substrates 1 and 2. Furthermore, when the projecting electrodes 9 are formed by using the etching method or the sandblasting method, an area on which no groove appears is provided at an edge of the bonded substrates 1 and 2, so that the bonding surfaces can be readily shut off from the outside. Here, the basic construction shown in FIGS. 6(a) and 6(b) is the same as that of FIGS. 5(a) and 5(b); hence, the explanation thereof is omitted.

Embodiment 3

The construction of a two-dimensional image detecting device of the present invention is not limited to those shown in FIGS. 1 through 6. The following explanation describes another construction of the two-dimensional image detecting devices described in Embodiments 1 and 2.

Here, the construction of the two-dimensional image detecting device regarding the present embodiment is similar to that of Embodiment 1, that is shown in FIG. 1; thus, those members that have the same functions and that are described in Embodiment 1 are indicated by the same reference numerals and the description thereof is omitted.

Like the two-dimensional image detecting devices of Embodiments 1 and 2, a two-dimensional image detecting device of the present embodiment has a construction in which an active-matrix substrate 1 and an opposing substrate 2 are joined to each other by bonding and electrically connecting the substrates.

Figure 7:
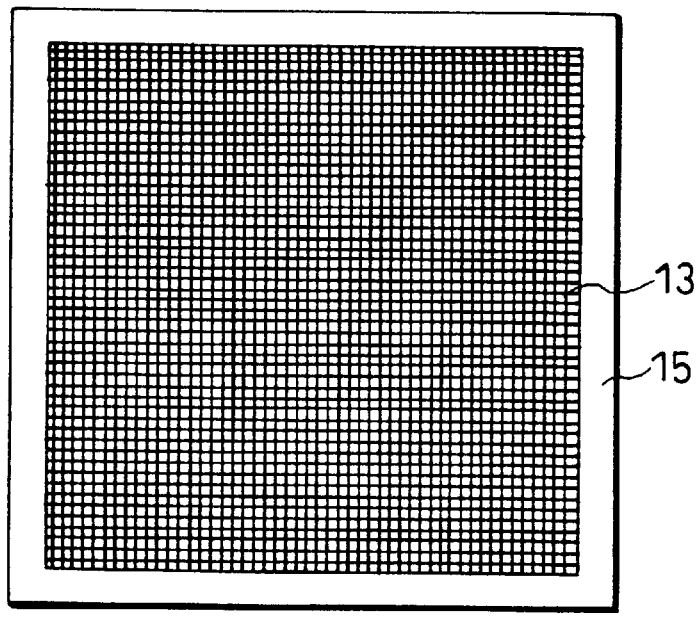
FIGS. 7(a) and 7(b) are a plan view and a sectional drawing schematically showing a construction of a two-dimensional image detecting device in accordance with a third embodiment of the present invention.
Figure 7:
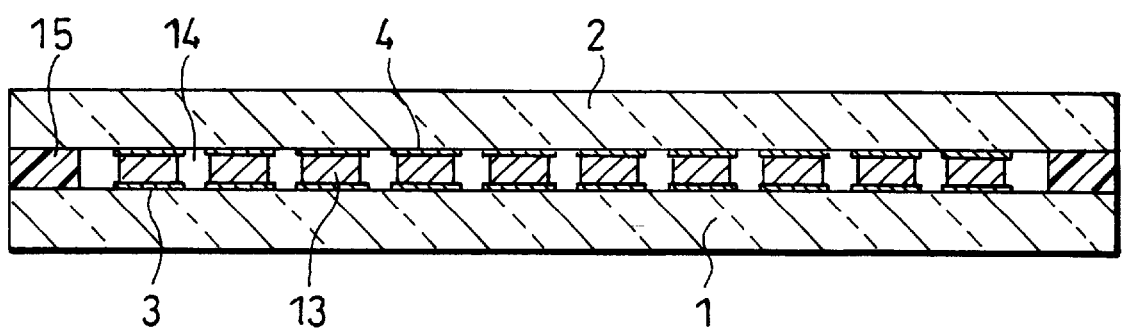

Here, as shown in FIGS. 7(a) and 7(b), the two-dimensional image detecting device of the present embodiment is characterized in that a material (conductive resin), which is obtained by dispersing fine carbon particles (conductive particles) into a photosensitive resin (resin) and offering conductivity to the resin, is used as conductive materials 13 for bonding and electrically connecting (a) the active-matrix substrate 1 including pixel electrodes and (b) the opposing substrate 2 including a photoconductive layer, and the conductive materials 13 are exposed and developed so as to be selectively patterned on pixel electrodes 3.

Further, in the present embodiment as well, the conductive materials 13 are selectively patterned and disposed on the pixel electrodes 3 of the active-matrix substrate 1, so that like Embodiment 2, spaces having no conductive material are formed between the adjacent electrodes. Therefore, in order to allow an autoclave operation (thermocompression by using an autoclave device 17) to apply sufficient pressure, it is necessary to provide an exterior wall (sealing means) 15 made of a sealing material (sealing resin) at an edge of the bonding surfaces of the substrates 1 and 2.

Furthermore, the present embodiment adopts a photosensitive resin having conductivity with a film thickness of 8 μm, as the conductive materials 13. Accordingly, the film thickness of the exterior wall 15 is set at around 10 μm so as to improve the hermeticity between the bonding surfaces of the substrates 1 and 2. A specific method for bonding the substrates 1 and 2 by using the autoclave device 17 is the same as that of Embodiment 2.

As described above, the present embodiment described the case in which the conductive materials 13 are patterned and disposed on the pixel electrodes 3 of the active-matrix substrate 1. However, a method for selectively disposing the conductive materials 13 on the electrodes is not limited to the above method. An electrodeposition method and a screen printing method are also available.

Additionally, the present embodiment adopts an epoxy resin as the sealing material forming the exterior wall 15, which seals the space between the bonding surfaces of the substrates 1 and 2 from the outside. Besides, it is possible to adopt other resins such as silicone resin having superior heat-resistance and hermeticity.

Figure 8:
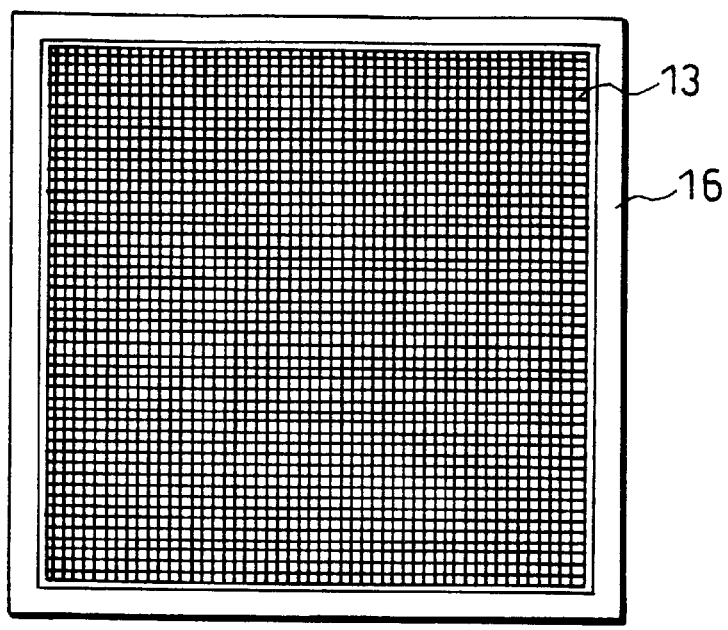
FIGS. 8(a) and 8(b) a plan view and a sectional drawing schematically showing a construction of a two-dimensional image detecting device in accordance with the third embodiment of the present invention.
Figure 8:
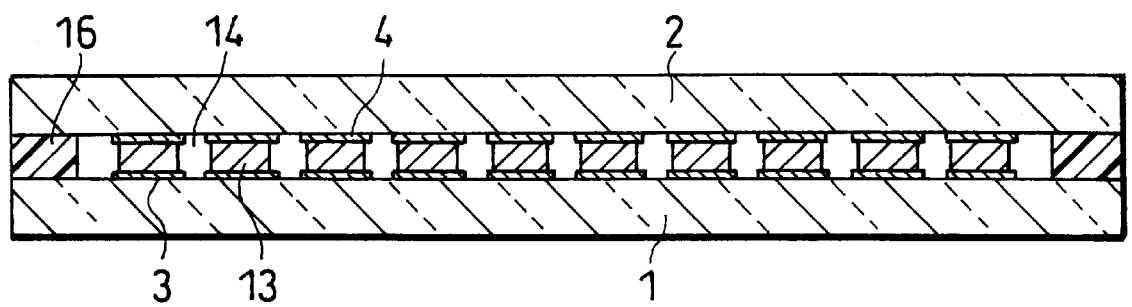

Moreover, in the present embodiment, the exterior wall 15, which seals the space between the bonding surfaces of the substrates 1 and 2 from the outside, is made of a sealing material. However, a method for forming the exterior wall is not limited to this method. For example, as shown in FIGS. 8(a) and 8(b), upon selectively forming the conductive materials 13 on the pixel electrodes 3, the same material as the conductive materials 13 can be used to form an exterior wall 16 at an edge of the bonded substrates 1 and 2. However, when the conductive members 13 are selectively disposed on the pixel electrodes 3 by using an electrodeposition method, it is necessary to previously form the pixel electrodes 3 on a part where the exterior wall 16 is to be formed. Here, the basic construction of FIGS. 8(a) and 8(b) is the same as that of FIGS. 7(a) and 7(b); thus, the explanation thereof is omitted.

Embodiment 4

A two-dimensional image detecting device of the present invention is not limited to the constructions shown in FIGS. 1 through 8. The following explanation describes another construction of the two-dimensional image detecting devices described in Embodiments 1 through 3.

Here, the construction of a two-dimensional image detecting device of the present embodiment is similar to that of the two-dimensional image detecting device of Embodiment 1, that is shown in FIG. 1; thus, those members that have the same functions and that are described in Embodiment 1 are indicated by the same reference numerals and the description thereof is omitted.

Like the two-dimensional image detecting devices of Embodiments 1 through 3, the two-dimensional image detecting device of the present embodiment has a construction in which an active-matrix substrate 1 and an opposing substrate 2 are joined to each other by bonding and electrically connecting the substrates.

Like Embodiment 2, the two-dimensional image detecting device of the present embodiment is characterized by adopting an anisotropic conductive adhesive 5 as a conductive material for bonding and electrically connecting the active-matrix substrate 1 including pixel electrodes 3 and the opposing substrate 2 including a photoconductive layer, and being provided with projecting electrodes (bump) 9 on either electrodes 3 or 4 of the substrates 1 and 2.

In Embodiment 2, when the projecting electrodes 9 cause spaces upon bonding the substrates 1 and 2 via the anisotropic conductive adhesive 5, in order to seal the spaces (grooves 10) appearing on the bonding surfaces of the substrates 1 and 2, an exterior wall is formed at an edge of the bonding surfaces of the substrates 1 and 2 so as to seal the spaces (grooves 10).

Meanwhile, in the present embodiment, the substrates 1 and 2 are bonded to each other without installing the exterior wall. Specifically, spaces between the bonding surfaces of the substrates 1 and 2 are sealed merely during an autoclave operation. The bonded substrates 1 and 2 are deaerated, so that an autoclave device 17 performs a complete contact bonding while the space between the bonding surfaces of the substrates 1 and 2 is sealed.

The steps of the autoclave device 17 are the same as those of Embodiment 1, before the complete contact-bonding operation to a temporary contact-bonding operation.

Namely, in the present embodiment, as shown in FIG. 4(a), the anisotropic conductive adhesive 5 is opposed to the active-matrix substrate 1, and deaeration is performed between the active-matrix substrate 1 and opposing substrate 2. Next, as shown in FIG. 4(b), a thermocompression is carried out while the deaeration is continued between the active-matrix substrate 1 and the anisotropic conductive adhesive 5, so that the anisotropic conductive adhesive 5 is transferred onto the active-matrix substrate 1.

And then, as shown in FIG. 4(c), the opposing substrate 2 is disposed at a bonding position so as to oppose the active-matrix substrate 1, and a deaerating operation is performed between the active-matrix substrate 1 and the opposing substrate 2. Next, as shown in FIG. 4(d), a thermocompression is performed while the deaeration is continued between the active-matrix substrate 1 and the opposing substrate 2, so that the active-matrix substrate 1 and the opposing substrate 2 are pre-bonded to each other.

Afterwards, in the present embodiment, the substrates 1 and 2 are bonded to each other without installing an exterior wall. Specifically, the space between the bonding surfaces of the substrates 1 and 2 are sealed merely during the autoclave operation. The bonded substrates 1 and 2 are deaerated, so that the autoclave device 17 performs a complete contact bonding while the space between the bonding surfaces of the substrates 1 and 2 is sealed. Namely, when the autoclave device 17 bonds the substrates 1 and 2 (complete contact bonding), in order to seal the space between the bonding surfaces of the substrates 1 and 2, the deaeration is performed between the active-matrix substrate 1 and the opposing substrate 2.

FIGS. 9(a) and 9(b) show a complete contact-bonding (joining) process regarding the active-matrix substrate 1 and the opposing substrate 2 of the present embodiment.

As the deaerating method for the complete contact bonding of the autoclave device 17, the same method as the deaerating method of FIG. 4(d) can be adopted. Namely, as shown in FIG. 9(a), the deaerating device of FIG. 4(d) is used so as to suck air in a film sheet 46, in a state in which the bonded substrates 1 and 2 are entirely covered with the film sheet 46 made of a material such as polytetrafluoroethylene (Teflon; trademark of E. I. du Pont de Nemours and Co.), so that deaeration is completed. At this time, the substrates 1 and 2 are disposed in the autoclave device 17 together with the deaerating device, and air outlets 45 are connected with a pressure reducing device (not shown) through air vents which are provided on the autoclave device 17.

Afterwards, while maintaining the reduced pressure in the film sheet 46, a thermocompression is performed on the substrates 1 and 2 from the above of the film sheet 46 by using the autoclave device 17. In this step, the anisotropic conductive adhesive 5 is cured so as to completely contact-bond the active-matrix substrate 1 and the opposing substrate 2.

Further, as a deaerating method of the autoclave device 17 upon performing the complete contact bonding, instead of the method shown in FIG. 9(*a*), a method shown in FIG. 9(*b*) is also available, in which a frame 25 is provided merely at an edge of the bonded substrates 1 and 2, and the inside pressure of the frame 25 is reduced so as to deaerate the space between the bonding surfaces of the substrates 1 and 2.

Additionally, the frame 25 is provided at an edge of the substrates 1 and 2 for sealing so as to keep a pressure of the space (including grooves 10) between the substrates 1 and 2 at a predetermined pressure, without being affected by pressure in the autoclave device 17. The frame 25 is provided with sealing rubbers 26 which seal between the frame 25 and the substrates 1 and 2, and between divided parts of the frame 25; and suction holes 27 which are connected with a pressure reducing device (not shown) for reducing pressure of the inside of the frame 25. Further, the substrates 1 and 2 are disposed in the autoclave device 17 together with the frame 25, and the suction holes 27 are connected to the pressure reducing device via the air vents provided on the autoclave device 17.

Upon completion of deaeration, while keeping the reduced pressure in the frame 25, the substrates 1 and 2 are subjected to a thermocompression by using the autoclave device 17. Hence, the anisotropic conductive adhesive 5 is cured so as to perform a complete contact bonding between the active-matrix substrate 1 and the opposing substrate 2.

In Embodiments 2 and 3, the space between the bonding surfaces of the substrates 1 and 2 is sealed. This is because the space between the upper and lower substrates 1 and 2, which have been bonded in the autoclave operation, is sealed from the outside, so as to keep a pressure difference between the inside atmosphere of the autoclave device 17 and the space between the substrates 1 and 2. Consequently, the same pressure as the inside of the autoclave device 17 is applied to the substrates 1 and 2. Therefore, unlike Embodiments 2 and 3, without arrangement including the frame at an edge of the bonding surfaces of the substrates 1 and 2, the present embodiment merely needs to temporarily seal the space between the bonding surfaces upon bonding the substrates 1 and 2, in order to sufficiently achieve an effect. With this arrangement, the present embodiment can eliminate the need for additional construction of the substrates 1 and 2 for sealing, so that it is possible to simplify the manufacturing process of the two-dimensional image detecting device.

Furthermore, without performing a deaerating operation between the bonding surfaces during the autoclave operation, merely initial deaeration to some extent can achieve some sealing effects. Namely, for example, regarding the method shown in FIG. 9(*a*), the following method is also available: after deaeration, the pressure reducing device is taken off and the air outlets 45 are connected to an external space (atmospheric pressure) so as to eliminate the reduced pressure state in the film sheet 46, and then, a thermocompression is performed by the autoclave device 17. Moreover, regarding the method shown in FIG. 9(*b*), the following method is also available: after deaeration, the pressure reducing device is taken off and the suction holes 27 are connected to an external space (atmospheric pressure) so as to eliminate the reduced pressure state inside the frame 25, and then, a thermocompression is performed by the autoclave device 17.

Figure 10:
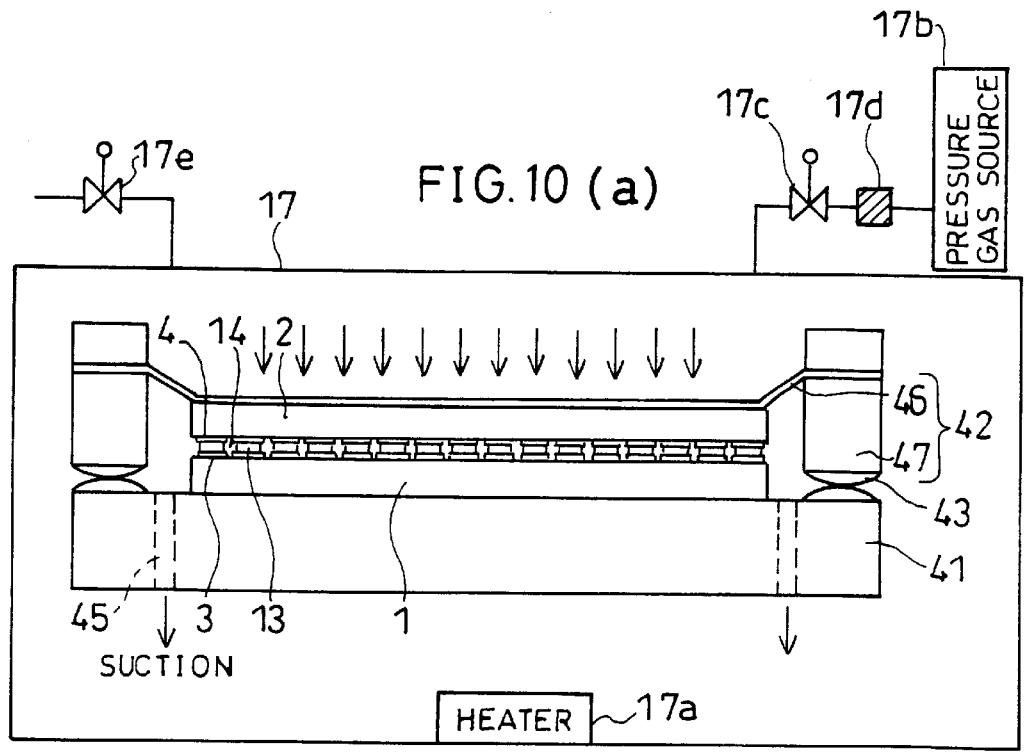
FIGS. 10(a) and 10(b) are sectional drawings showing a manufacturing device of the two-dimensional image detecting device in accordance with the fourth embodiment of the present invention.
Figure 10:
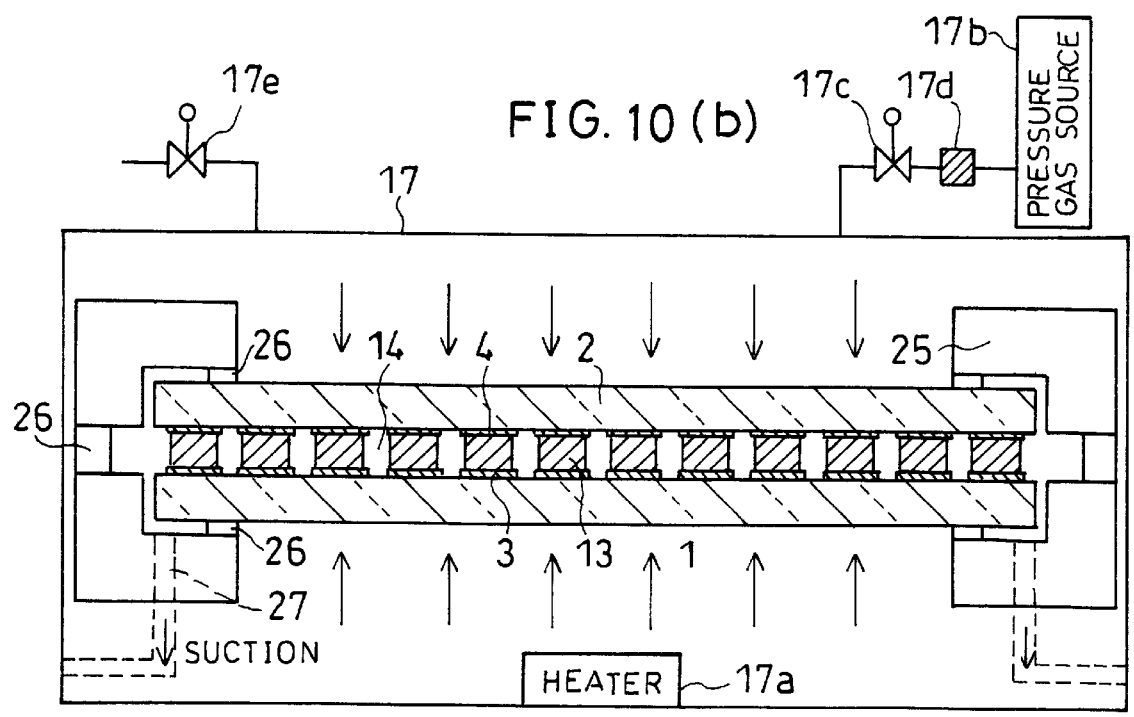
Figure 11:
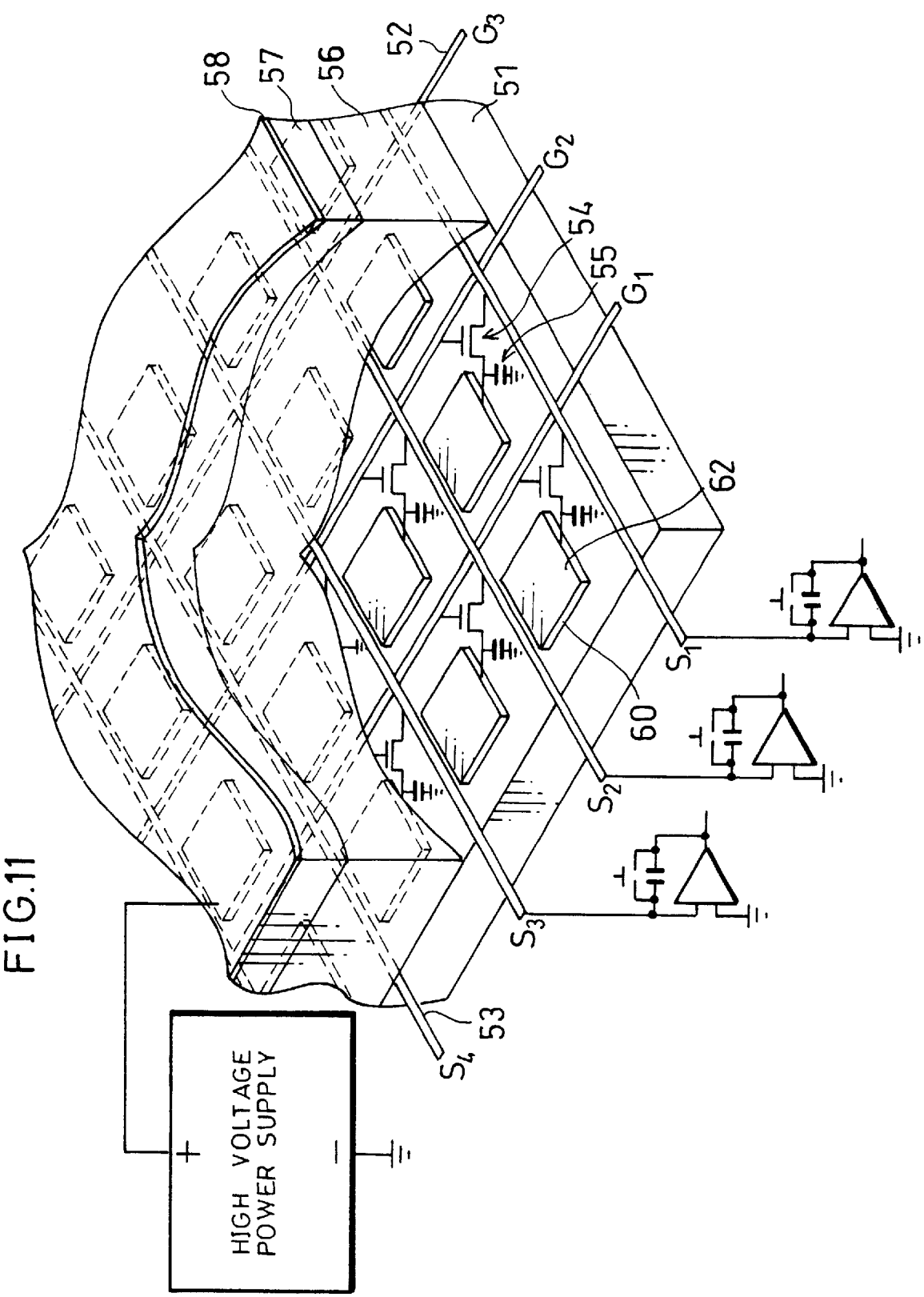
FIG. 11 is a perspective view schematically showing a construction of a conventional two-dimensional image detecting device.
Figure 12:
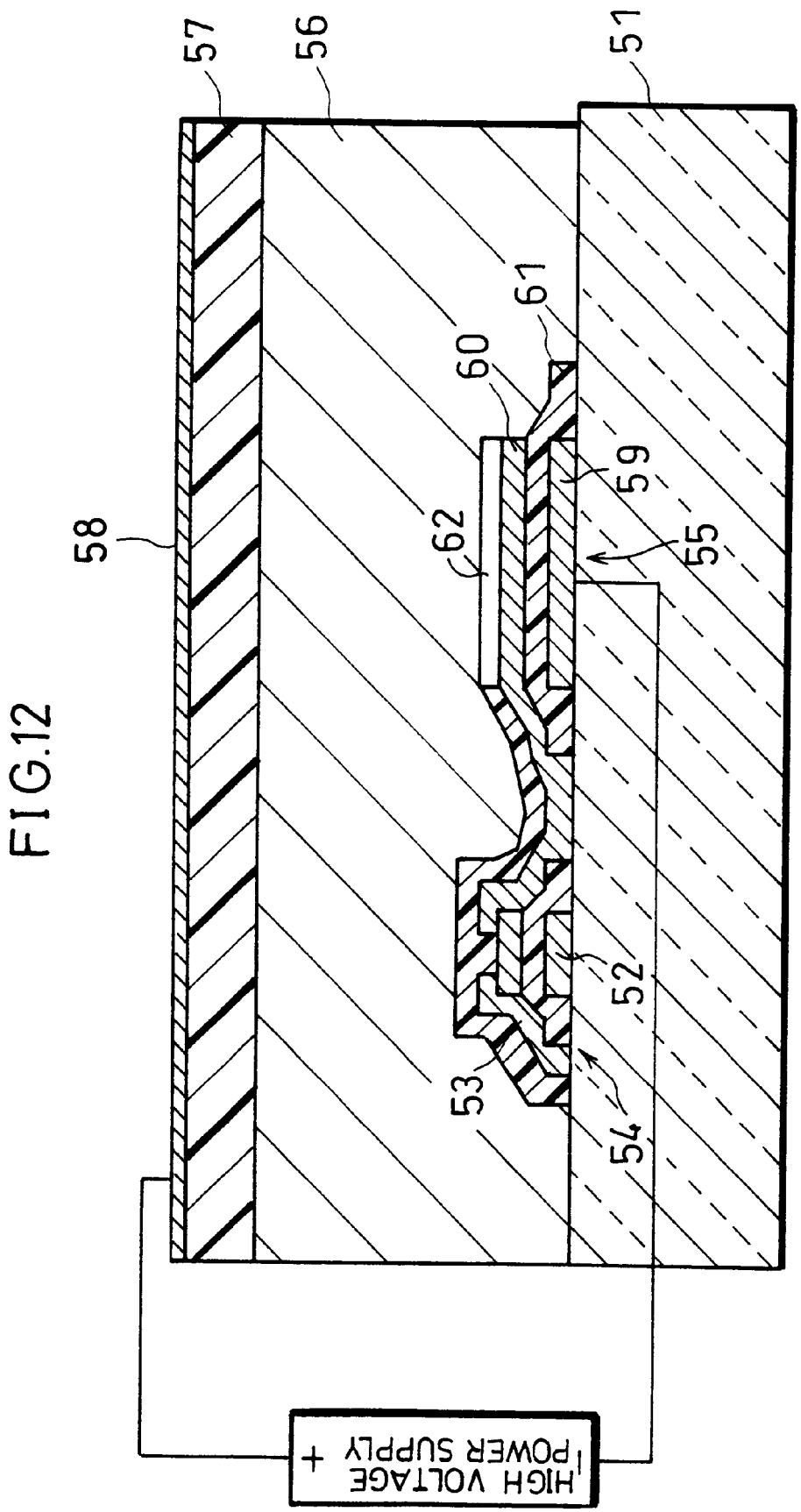
FIG. 12 is a sectional view schematically showing a construction for one pixel of the conventional two-dimensional image detecting device.

Additionally, as described in Embodiment 3, even when the conductive materials 13 are selectively disposed on the electrodes 3 and 4 so as to form spaces among the conductive materials 13, for example, as shown in FIGS. 10(*a*) and 10(*b*), it is possible to seal the space between the bonding surfaces without installing the external wall on the surfaces of the substrates 1 and 2, in the same manner as the aforementioned method. Here, in this case, the steps before the contact bonding of the autoclave device 17 to the temporary contact bonding are the same as those of Embodiment 1, and the basic constructions of FIGS. 10(*a*) and 10(*b*) are similar to those of FIGS. 9(*a*) and 9(*b*), so that the explanation thereof is omitted. However, in this case, deaeration can be omitted.

As described above, according to the present invention, upon bonding an active-matrix substrate and an opposing substrate, spaces which appear in gaps (grooves) among projections (projecting electrode) are sealed from the outside, or spaces which appear in gaps among conductive materials are sealed from the outside, the projections corresponding to pixel electrodes, the conductive materials being selectively patterned so as to correspond to the pixel electrodes.

Therefore, due to a pressure difference between the outside and a space between the bonding surfaces of the substrates, it is possible to apply to the entire substrates the same pressure as the inside of a bonding device (autoclave device).

Further, a sealing means (external wall) is formed at an edge of the bonding surfaces of the substrates so as to shut off the space between the substrates from the outside. Thus, it is also possible to protect the space between the bonding surfaces of the substrates and to improve bonding strength.

Furthermore, upon bonding the active-matrix substrate and the opposing substrate, the present invention makes it possible to evenly press the entire substrates regardless of the size of the substrates. The pressure can be readily adjusted in accordance with a kind of the conductive materials which connect the substrates. Additionally, a heating medium has a large density under a pressurized gas atmosphere, so that a heating rate increases in a heating operation, thereby reducing the manufacturing time.

Further, as described above, a two-dimensional image detecting device of the present invention, which is provided with a pixel alignment layer having electrode wires disposed in a lattice form, a plurality of switching elements disposed respectively at intersections, and storage capacitors including the pixel electrodes connected with the electrode wires; electrode sections formed so as to oppose virtually the entire pixel alignment layer; and a semiconductive layer formed with photoconductivity between the pixel alignment layer and the electrode sections, the two-dimensional image detecting device being provided with the active-matrix substrate including the pixel alignment layer and the opposing substrate including the electrode sections and the semiconductor layer, wherein the substrates are disposed such that the pixel alignment layer of the active-matrix substrate and the semiconductive layer of the opposing substrate oppose each other, the substrates are bonded and electrically connected to each other via the conductive materials, projections are formed corresponding to the pixel electrodes on at least one of the connecting surfaces of the active-matrix substrate and the opposing substrate, and a sealing means is formed at an edge of the connecting surfaces so as to shut off the space between the substrates from the outside.

With this arrangement, upon bonding the active-matrix substrate and the opposing substrate, spaces, which appear in grooves among the projections corresponding to the pixel electrodes, are sealed from the outside, so that because of a pressure difference between the outside and the space between the bonding surfaces of the substrates, it is possible to apply the same pressure as the inside of the bonding device, to the entire of the substrates.

Further, according to this arrangement, the space between the bonding surfaces of the substrates is structurally sealed, so that an additional process is not necessary in the manufacturing process of the two-dimensional image detecting device.

Furthermore, according to this arrangement, the sealing means is formed at an edge of the bonding surfaces of the substrates so as to shut off the space between the substrates from the outside, so that it is also possible to protect the space between the bonding surfaces of the substrates and to improve the bonding strength.

Moreover, as described above, the sealing means is preferably an external wall formed at an edge of the active-matrix substrate.

Additionally, as mentioned above, the external wall is preferably made of a sealing resin such as a sealing resin (sealing material) used for manufacturing a liquid crystal display. Hence, for example, when the sealing resin is an ultraviolet curing resin, after the pattern of the ultraviolet curing resin has been applied and patterned at an edge of the active-matrix substrate, merely irradiation of ultraviolet radiation is necessary for forming the external wall. Further, when the sealing resin is a thermosetting resin, after the thermosetting resin has been applied and patterned at an edge of the active-matrix substrate, merely a heating operation is necessary for forming the external wall. Therefore, the external wall can be readily formed.

Moreover, as mentioned above, the external wall is preferably made of the same material as that of the projections formed corresponding to the pixel electrodes. Hence, upon forming the projections, the external wall can be formed at the same time, so that it is possible to reduce the number of the steps.

Further, as described above, the two-dimensional image detecting device of the present invention, which is provided with the pixel alignment layer having the electrode wires disposed in a lattice form, a plurality of the switching elements disposed respectively at the intersections, and the storage capacitors including the pixel electrodes connected with the electrode wires; the electrode sections formed so as to oppose virtually the entire pixel alignment layer; and the semiconductive layer formed with photoconductivity between the pixel alignment layer and the electrode sections, the two-dimensional image detecting device being provided with the active-matrix substrate including the pixel alignment layer and the opposing substrate including the electrode sections and the semiconductor layer, wherein the substrates are disposed such that the pixel alignment layer of the active-matrix substrate and the semiconductive layer of the opposing substrate oppose each other, the substrates are bonded and electrically connected to each other via the conductive materials, the conductive materials are selectively patterned and disposed corresponding to the pixel electrodes, and a sealing means is formed at an edge of the connecting surfaces so as to shut off the space between the substrates from the outside.

With this arrangement, upon bonding the active-matrix substrate and the opposing substrate, spaces appear between the adjacent conductive materials selectively patterned and disposed so as to correspond to the pixel electrodes, and the spaces are sealed from the outside; thus, because of a pressure difference between the outside and the space between the bonding surfaces of the substrates, it is possible to apply the same pressure as the inside of the bonding device to the entire substrates.

Moreover, according to this arrangement, the space between the bonding surfaces of the substrates is structurally sealed, so that an additional process is not necessary in the manufacturing process of the two-dimensional image detecting device.

Furthermore, according to this arrangement, the sealing means is formed at an edge of the bonding surfaces of the substrates so as to shut off the space between the substrates from the outside, so that it is also possible to protect the space between the bonding surfaces of the substrates and to improve the bonding strength.

Moreover, as described above, the sealing means is preferably an external wall formed at an edge of the active-matrix substrate.

Additionally, as mentioned above, the external wall is preferably made of a sealing resin such as a sealing resin (sealing material) used for manufacturing a liquid crystal display. Hence, for example, when the sealing resin is an ultraviolet curing resin, after the pattern of the ultraviolet curing resin has been applied and patterned at an edge of the active-matrix substrate, merely irradiation of ultraviolet radiation is necessary for forming the external wall. Further, when the sealing resin is a thermosetting resin, after the pattern of the thermosetting resin has been applied and patterned at an edge of the active-matrix substrate, merely a heating operation is necessary for forming the external wall. Therefore, the external wall can be readily formed.

Moreover, as mentioned above, the external wall is preferably made of the same material as that of the conductive materials selectively patterned and disposed corresponding to the pixel electrodes. Hence, upon forming the conductive materials, the external wall can be formed at the same time, so that it is possible to reduce the number of the steps.

Additionally, as described above, a method for manufacturing the two-dimensional image detecting device of the present invention, the two-dimensional image detecting device being provided with a pixel alignment layer having electrode wires disposed in a lattice form, a plurality of switching elements disposed respectively at intersections, and storage capacitors including the pixel electrodes connected with the electrode wires; electrode sections formed so as to oppose virtually the entire pixel alignment layer; and a semiconductive layer formed with photoconductivity between the pixel alignment layer and the electrode sections, the method including the steps of manufacturing the active-matrix substrate including the pixel alignment layer; manufacturing the opposing substrate including the electrode sections and the semiconductive layer; disposing the conductive materials on at least one of the connecting surfaces of the active-matrix substrate and the opposing substrate; arranging the substrates such that the connecting surface of the substrate, on which the conductive materials are disposed, oppose the connecting surface of the other substrate; and bonding and electrically connecting the opposing substrates via the conductive materials by performing a heating operation while conducting the bonding by a heating operation and applying pressure to the overlaid active-matrix substrate and opposing substrate by using an autoclave device.

Furthermore, upon bonding the active-matrix substrate and the opposing substrate, the present invention makes it possible to evenly press the entire substrates regardless of the size of the substrates. The pressure can be readily adjusted in accordance with a kind of the conductive materials which connect the substrates. Additionally, a heating medium has a large density under a pressurized gas atmosphere, so that a heating rate increases in a heating operation, thereby reducing the manufacturing time.

Also, as described above, according to the manufacturing method of the present invention, it is preferable to connect the active-matrix substrate, the opposing substrate, and the conductive materials while deaerating the spaces appearing on the connecting surfaces thereof. This arrangement makes it possible to previously prevent air bubbles from being caught between the substrates and to connect the active-matrix substrate and the opposing substrate with high reliability.

Moreover, as mentioned above, in the step of disposing the conductive materials on at least one of the connecting surfaces of the active-matrix substrate and the opposing substrate, the conductive material is preferably formed into a film, and it is preferable to dispose the conductive materials while deaerating spaces appearing on the bonding surfaces of the conductive materials and the substrates, by using heating rollers. This arrangement makes it possible to previously prevent air bubbles from being caught between the conductive materials and the substrates.

Further, as described above, in the step of bonding and electrically connecting the opposing substrates via the conductive materials, it is preferable to pre-bond the opposing substrates in advance and to perform a deaerating operation. This arrangement can previously prevent air bubbles from being caught between the substrates, thereby reducing the occurrence of a connecting defect between the active-matrix substrate and the opposing substrate.

Furthermore, as described above, in the step of bonding and electrically connecting the opposing substrates via the conductive materials, when a thermocompression is performed by using the autoclave device, it is preferable to connect the substrates while deaerating the spaces appearing on the bonding surfaces of the substrates. This arrangement makes it possible to previously prevent air bubbles from being caught between the substrates and to keep a pressure difference between the outside and the space between the bonding surfaces of the substrates.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A two-dimensional image detecting device comprising:
    an active-matrix substrate which includes a plurality of electrode wires being disposed in a lattice form so as to intersect at a plurality of intersections, a plurality of switching elements respectively disposed at the intersections, and a plurality of pixel electrodes connected to said electrode wires via said switching elements;
    an opposing substrate which includes electrode sections and a semiconductive layer having photoconductivity between said electrode sections and said pixel electrodes,
    wherein said active-matrix substrate and said opposing substrate are disposed such that said pixel electrodes and said semiconductive layer oppose each other,
    said pixel electrodes and said semiconductive layer are bonded to each other and are electrically connected to each other via a conductive material,
    sealing means is further provided at an edge of a connecting surface of either said active-matrix substrate or said opposing substrate so as to shut off a space between said active-matrix substrate and said opposing substrate.

2. The two-dimensional image detecting device as defined in claim 1, wherein projecting electrodes are formed in correspondence with said pixel electrodes on the connecting surface of either said active-matrix substrate or said opposing substrate so as to connect the surface and said conductive material.

3. The two-dimensional image detecting device as defined in claim 2, wherein said sealing means is an external wall made of the same material as said projecting electrode.

4. The two-dimensional image detecting device as defined in claim 1, wherein said conductive material is selectively patterned and disposed at positions corresponding to said pixel electrodes.

5. The two-dimensional image detecting device as defined in claim 4, wherein said sealing means is an external wall made of the same material as said conductive material being selectively patterned and disposed at positions corresponding to said pixel electrodes.

6. The two-dimensional image detecting device as defined in claim 1, wherein said sealing means is a sealing resin disposed at an edge of at least one of said active-matrix substrate and said opposing substrate.

7. The two-dimensional image detecting device as defined in claim 1, wherein said semiconductive layer is made of a polycrystal material and/or a crystal material.

8. The two-dimensional image detecting device as defined in claim 1, wherein said semiconductive layer is made of a II–VI semiconductor.

9. The two-dimensional image detecting device as defined in claim 1, wherein said semiconductive layer includes CdTe and/or CdZnTe.

10. The two-dimensional image detecting device as defined in claim 1, wherein said semiconductive layer constitutes a photodiode.

11. The two-dimensional image detecting device as defined in claim 1, wherein said semiconductive layer constitutes a PIN photodiode.

12. The two-dimensional image detecting device as defined in claim 1, wherein said conductive material is an anisotropic conductive film which is constituted by a resin and conductive particles dispersed in the resin, and has conductivity merely in a direction of normal to a surface of said pixel electrode that opposes said semiconductive layer.

13. The two-dimensional image detecting device as defined in claim 1, wherein said conductive material is a conductive resin which is constituted by a resin and conductive particles dispersed in the resin.

14. A manufacturing method for a two-dimensional image detecting device comprising:

(a) forming an active-matrix substrate which has a plurality of electrode wires being disposed in a lattice form so as to intersect at a plurality of intersections, a plurality of switching elements respectively disposed at the intersections, and a plurality of pixel electrodes connected to said electrode wires via said switching elements, (b) forming an opposing substrate which has electrode sections and a semiconductive layer having photoconductivity between said electrode sections and said pixel electrodes, (c) disposing a conductive material on either a pixel electrode side of said active-matrix substrate or a semiconductive layer side of said opposing substrate, (d) overlaying said active-matrix substrate and said opposing substrate onto each other such that the pixel electrode side of said active-matrix substrate and the semiconductive layer side of said opposing substrate oppose each other, (e) bonding said overlaid active-matrix substrate and opposing substrate and connecting said substrates electrically via said conductive material, wherein said step (e) includes performing a heating operation while applying pressure to the overlaid active-matrix substrate and opposing substrate by using an autoclave device, and sealing an edge of said overlaid active-matrix substrate and opposing substrate so as to shut off a space between said active-matrix substrate and said opposing substrate, before said heating of step (e).

15. The manufacturing method for the two-dimensional image detecting device as defined in claim 14, wherein said step (c) includes disposing said conductive material formed into a film while deaerating a space appearing between said conductive material formed into a film and a bonding surface of either said active-matrix substrate or said opposing substrate, by using heating rollers.

16. The manufacturing method for a two-dimensional image detecting device as defined in claim 14, further comprising step (f) for pre-bonding said overlaid active-matrix substrate and opposing substrate, before said step (e).

17. The manufacturing method for a two-dimensional image detecting device as defined in claim 16, wherein said step (f) includes performing a deaerating operation.

18. The manufacturing method for a two-dimensional image detecting device as defined in claim 14, wherein said step (e) including performing a thermocompression and heating operation by using said autoclave device while deaerating a space appearing between bonding surfaces of said active-matrix substrate and said opposing substrate.

19. The method of claim 14, further comprising forming an exterior wall on either one of the active matrix substrate and the opposing substrate before step (g).

20. A manufacturing method for a two-dimensional image detecting device comprising the steps of:

(a) forming an active-matrix substrate which has a plurality of electrode wires being disposed in a lattice form so as to intersect at a plurality of intersections, a plurality of switching elements respectively disposed at the intersections, and a plurality of pixel electrodes connected to said electrode wires via said switching elements, (b) forming an opposing substrate which has electrode sections and a semiconductive layer having photoconductivity between said electrode sections and said pixel electrodes, (c) disposing a conductive material on either a pixel electrode side of said active-matrix substrate or a semiconductive layer side of said opposing substrate, (d) overlaying said active-matrix substrate and said opposing substrate onto each other such that the pixel electrode side of said active-matrix substrate and the semiconductive layer side of said opposing substrate oppose each other, and (e) bonding said overlaid active-matrix substrate and opposing substrate and connecting said substrates electrically via said conductive material, wherein before said step (e), step (g) is further included for sealing an edge of said overlaid active-matrix substrate and opposing substrate so as to shut off a space between said active-matrix substrate and said opposing substrate from outside.

21. The manufacturing method for the two-dimensional image detecting device as defined in claim 20, wherein said step (e) allows an outside of said overlaid active-matrix substrate and opposing substrate to enter a pressurized gas atmosphere.

* * * * *